(12) United States Patent
Ronsse et al.

(10) Patent No.: US 8,496,780 B2
(45) Date of Patent: Jul. 30, 2013

(54) APPARATUS FOR THE DEPOSITION OF HIGH DIELECTRIC CONSTANT FILMS

(75) Inventors: Bobby M. Ronsse, Escondido, CA (US); Craig R. Metzner, Fremont, CA (US); Richard Omar Collins, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 998 days.

(21) Appl. No.: 11/356,725

(22) Filed: Feb. 17, 2006

(65) Prior Publication Data

US 2006/0196421 A1    Sep. 7, 2006

Related U.S. Application Data

(63) Continuation of application No. 10/251,715, filed on Sep. 20, 2002, now abandoned, which is a continuation-in-part of application No. 09/179,921, filed on Oct. 27, 1998, now Pat. No. 6,454,860.

(51) Int. Cl.
*C23C 16/00* (2006.01)
*C23F 1/00* (2006.01)
*H01L 21/306* (2006.01)

(52) U.S. Cl.
USPC ........................... 156/345.34; 118/715

(58) Field of Classification Search
USPC ........................... 118/715; 156/345.34
See application file for complete search history.

(56) References Cited

U.S. PATENT DOCUMENTS

| | | | |
|---|---|---|---|
| 4,680,061 A * | 7/1987 | Lamont, Jr. | 250/398 |
| 5,096,670 A * | 3/1992 | Harris et al. | 422/65 |
| 5,356,451 A * | 10/1994 | Cain et al. | 65/414 |
| 5,362,328 A * | 11/1994 | Gardiner et al. | 118/726 |
| 5,370,739 A * | 12/1994 | Foster et al. | 118/725 |
| 5,595,606 A * | 1/1997 | Fujikawa et al. | 118/725 |
| 5,630,878 A | 5/1997 | Miyamoto et al. | |
| 5,660,528 A | 8/1997 | Tsunenari | |
| 5,785,902 A | 7/1998 | Yamaguchi et al. | |
| 5,788,778 A | 8/1998 | Shang et al. | |
| 5,878,503 A | 3/1999 | Howe et al. | |
| 5,882,419 A | 3/1999 | Sinha et al. | |
| 6,056,823 A * | 5/2000 | Sajoto et al. | 118/715 |
| 6,110,531 A * | 8/2000 | Paz de Araujo et al. | 427/255.25 |
| 6,282,388 B1 | 8/2001 | Horle et al. | |
| 6,296,711 B1 * | 10/2001 | Loan et al. | 118/726 |
| 6,451,692 B1 | 9/2002 | Derderian et al. | |
| 2002/0076492 A1 | 6/2002 | Loan et al. | |
| 2002/0076508 A1 | 6/2002 | Chiang et al. | |

FOREIGN PATENT DOCUMENTS

| | | |
|---|---|---|
| EP | 1 069 599 A | 1/2001 |
| WO | WO 01/98556 A | 12/2001 |

OTHER PUBLICATIONS

EPO Search Report, EP application No. 03759431.4, dated Jun. 19, 2006. page count (4) four.

* cited by examiner

*Primary Examiner* — Keath Chen

(74) *Attorney, Agent, or Firm* — Patterson & Sheridan, LLP

(57) ABSTRACT

An integrated deposition system is described that is capable of vaporizing low vapor pressure liquid precursors and conveying the vapor to a processing region to fabricate advanced integrated circuits. The integrated deposition system includes a heated exhaust system, a remote plasma generator, a processing chamber, a liquid delivery system, and a computer control module that together create a commercially viable and production worthy system for depositing high capacity dielectric materials from low vapor pressure precursors.

17 Claims, 27 Drawing Sheets

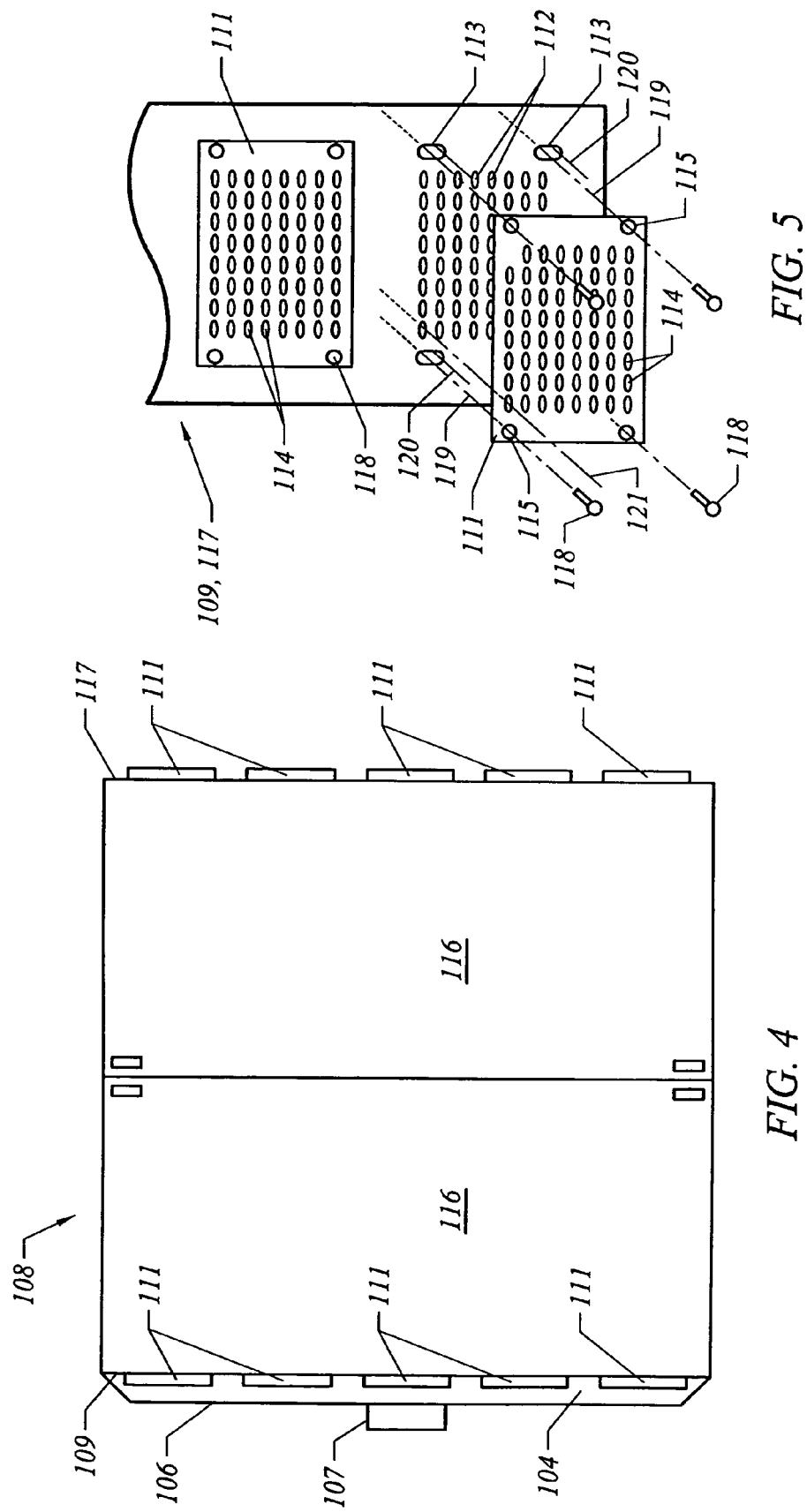

APPARATUS FOR THE DEPOSITION OF HIGH DIELECTRIC CONSTANT FILMS

CROSS-REFERENCE TO RELATED APPLICATIONS

This application is a continuation of U.S. patent application Ser. No. 10/251,715, filed Sep. 20, 2002 which is a continuation-in-part of U.S. patent application Ser. No. 09/179,921, filed Oct. 27, 1998, now U.S. Pat. No. 6,454,860, both of which are incorporated by reference in their entireties.

BACKGROUND OF THE INVENTION

1. Field of the Invention

The invention relates to an apparatus for the vaporization of liquid precursors and the controlled delivery of those precursors to form films on suitable substrates. More specifically, this invention concerns an apparatus for the deposition of a high dielectric constant film on a silicon wafer to make integrated circuits useful in the manufacture of advanced dynamic random access memory modules and other semiconductor devices.

2. Description of the Related Art

As the dimensions of the transistors continue to decrease, the continued use of silicon dioxide as a dielectric gate material is problematic. The fundamental problem is the need to keep the capacitance of the gate high while the area of the gate is shrinking faster than the thickness of the gate dielectric stack. The capacitance C of the gate is given by $C=k\epsilon_o A/d$ where A is the area of the gate, d is the thickness of the dielectric stack, k is the dielectric constant, and $\epsilon_o$ is the permittivity of free space. To ensure higher gate oxide capacitance, the silicon dioxide layer thickness has been decreased to less than 2 nanometers and future generations may require a further reduction below 1.0 nanometer. Since the dominant transport mechanism for silicon dioxide ($SiO_2$) films less than approximately 3 nanometers thick is by direct tunneling of electrons or holes, the leakage current density increases exponentially with decreasing thickness. A typical leakage current density for 1.5 nanometers thick $SiO_2$ at 1 V is about 1 A/cm². But, as the $SiO_2$ thickness approaches 1 nanometer, the leakage-current density approaches an unacceptable 100 A/cm² at the same operating voltage.

Consequently, there is a need for an alternative gate dielectric material that can be used in a large enough physical thickness to reduce current leakage density and still provide a high gate capacitance. In order to achieve this, the alternative gate dielectric material must have a dielectric constant that is higher than that of silicon dioxide. Typically, the thickness of such an alternative dielectric material layer is expressed in terms of the equivalent oxide thickness (EOT). Thus, the equivalent oxide thickness (EOT) of an alternative dielectric layer in a particular capacitor is the thickness that the alternative dielectric layer would have if its dielectric constant were that of silicon dioxide.

Another consideration in selecting an alternative dielectric material is the mobility of electrons in the transistor channel. The material selected for the dielectric film effects the mobility of the carriers in the transistor channel, thereby affecting overall transistor performance. Thus, it is desirable to find an alternative dielectric material for which the mobility of carriers in the transistor channel is equivalent to or higher than that for silicon dioxide gate dielectric films. For future generation transistors, a peak mobility of 400 cm²/V·s or greater is desirable.

This drive toward smaller transistors is driven by the desire for more integrated circuits (ICs) on a semiconductor die. Manufacturers are interested in replacing today's 64 megabit DRAM with memory devices in the range of 256 megabit, 1 gigabit, and higher. This need for more ICs on the same or smaller substrate footprint makes it necessary to replace conventional dielectric films, such as $SiO_2$, with dielectric films having higher dielectric constants ("High k" films).

High k films are desirable because their higher dielectric constants mean they provide higher capacitance that enables closer spacing of devices without electrical interference. Such closer spacing can increase transistor density. In addition, capacitor size can be reduced because capacitors containing high dielectric constant materials, such as tantalum oxide ($Ta_2O_5$), usually have much larger capacitance densities than standard $SiO_2$—$Si_3N_4$—$SiO_2$ stack capacitors. In fact, tantalum oxide has a relative dielectric constant more than six times that of $SiO_2$. Thus, High k materials such as tantalum oxide are becoming the materials of choice in IC fabrication.

One common method of forming a tantalum oxide film is to vaporize a liquid tantalum precursor and then deliver the tantalum vapor to a deposition chamber. FIG. 1, which is a graph of Vapor Pressure (Torr) vs. Temperature (□ C) of various compositions, graphically illustrates the large variation among the vapor pressures of tantalum precursors and other representative prior-art precursors for other semiconductor related processes. For example, at 100□ C and 1 atm TAT-DMAE has about 0.3 Torr vapor pressure while TAETO has about 0.03 Torr vapor pressure. The vapor pressures for tantalum precursors are remarkably lower than those of precursors typically used in prior art vapor delivery systems. Again referring to FIG. 1, at 100 C and 1 atm, TEOS (Tetra Ethyl Ortho Silicate), which is commonly used in chemical vapor deposition processes to form $SiO_2$ films and is supplied by several prior art vapor delivery systems, has a vapor pressure of almost 100 Torr. As a result of the vast difference in vapor pressure illustrated by TAETO and TEOS, prior art vapor delivery systems do not encounter and do not provide solutions to many of the challenges resulting from the use of very low vapor pressure precursors such as TAETO and TAT-DMAE.

Prior art vapor delivery systems commonly use an integrated liquid flow controller and vaporizer without a positive liquid shut-off valve. Such a configuration, when used with low vapor pressure tantalum precursors, can lead to problems stabilizing the tantalum vapor output and difficulty achieving the constant, repeatable tantalum vapor output desired in semiconductor device fabrication. Prior art delivery systems for TEOS and other relatively high vapor pressure materials allow for the flow controller and vaporizer to be separated by a considerable distance or attach no significance to the distance between vaporizer and liquid flow meter. Positioning the vaporizer and flow meter according to prior art systems fails to adequately control precursor vapor in the case of low vapor pressure precursors.

Previous delivery systems also have cleaning systems that are intended for use with higher vapor pressure precursors whose residuals can be adequately removed ("purged") by applying low pressure or "pumping-down" the lines while flowing a gas like nitrogen that is inert, relative to these materials. Purging techniques such as these fail with tantalum systems because the residual tantalum precursor has such a low vapor pressure that to remove it a system must introduce a solvent, such as isopropyl alcohol, ethanol, hexane, or methanol, into both the vaporization system and supply lines.

Previous vapor delivery systems avoided precursor vapor condensation by heating the delivery lines. These heating systems usually resorted to a flexible resistive heater that was wrapped around and held in direct contact with the line and then insulated. Since such systems typically operated with precursor materials having a wide temperature range within which the precursor remained vaporous, they did not need to sample the temperature of the heated line in as many locations. Typically, a single thermocouple would be used to represent the temperature of piping sections as long as four to six feet. Unfortunately, since the object of these large scale temperature control systems is to heat and monitor an average temperature of a large section of piping, these systems lack the ability to specifically control a single, smaller section of the vapor piping. An additional detriment is that these systems generally have very low efficiency when higher line temperatures are desired.

Vaporized tantalum delivery systems need to maintain the tantalum vapor above the vaporization temperature but below the decomposition temperature for a given tantalum precursor. Thus, once formed, the vaporous tantalum must be maintained at elevated temperatures between about 130° C. and 190° C. for TAT-DMAE and between about 150° C. and 220° C. for TAETO. Because of the relatively high temperatures needed and the narrow temperature band available to low vapor pressure precursors such as TAT-DMAE and TAETO, tantalum and other low vapor pressure liquid delivery systems would benefit from vapor delivery line temperature controls and methods that can achieve and efficiently provide the higher temperatures and greater temperature control needed for tantalum vapor delivery. Additionally, more precise temperature controls are needed since the usable temperature range of vaporized low pressure liquids is smaller than the usable range of prior art liquids. Because higher temperature vapor delivery is needed, tantalum delivery systems would benefit from designs that minimize the length of heated vapor delivery lines. Minimizing the length of lines requiring heating not only reduces the overall system complexity but also decreases the footprint or overall size of the system.

Current methods of tantalum oxide deposition use reaction rate limited chemical vapor deposition techniques. In reaction rate limited deposition processes, the deposition rate achieved is largely influenced by the temperature of the reaction environment. Existing chemical vapor deposition reactors do not sufficiently address the thermal losses from the substrate onto which the tantalum film is to be formed and the internal chamber components such as the gas distribution showerhead. Such thermal losses result in a non-uniform thickness of deposited tantalum and this non-uniformity is one barrier to having commercially viable tantalum oxide film formation techniques. Also, a commercially viable tantalum deposition requires a viable, in-situ cleaning process that can remove tantalum deposition formed on internal chamber components without harm to these components.

Thus, there is a need for a deposition apparatus that can deliver vaporized, measured High k precursors, such as tantalum, hafnium, or zirconium precursors, that have been adequately mixed with process gases to a reaction chamber that provides a controlled deposition environment that overcomes the shortcomings of the previous systems.

BRIEF SUMMARY OF THE INVENTION

This invention provides an apparatus for depositing a film, particularly a High k film. To deliver High k films better, an embodiment of the apparatus has a shortened vapor delivery system in which the conduits from the vapor delivery system to the processing region are segmented into multiple individually heated and controlled sections that allow precise vapor temperature control. Additionally, an embodiment of the apparatus segments the gas and liquid delivery systems into separate but similar individually heated and controlled sections to improve vapor temperature control. Further, an embodiment of the apparatus segments the chamber assembly into individually controlled sections that are heated to allow more precise vapor temperature control, to reduce vapor deposition on the chamber itself, and to reduce chamber assembly temperature where warranted. Additionally, an embodiment of the invention allows for the simultaneous delivery of two separate High k sources, thus allowing for multi-component film deposition.

In one embodiment the apparatus includes: a chamber assembly including a chamber body and a processing region; a first vaporizer; and a vapor delivery system connecting said first vaporizer and said processing region with a first vapor path of less than approximately three feet from said first vaporizer through said vapor delivery system to said processing region.

In another embodiment the apparatus includes: a chamber assembly including a chamber body, a chamber lid, and a processing region; a first vaporizer; a vapor delivery system connecting the first vaporizer to the processing region, the vapor delivery system including: a vapor delivery manifold wherein: the vapor delivery manifold is mounted on the chamber lid; the first vaporizer is mounted on the vapor delivery manifold; and the vapor delivery manifold connects the first vaporizer to the processing region.

Yet another embodiment of the apparatus includes: a chamber assembly including a chamber body, a chamber lid, and a processing region; a first vaporizer; a vapor delivery system connecting the first vaporizer to the processing region, the vapor delivery system including: a vapor delivery manifold wherein: the vapor delivery manifold is mounted on the chamber lid; the first vaporizer is mounted on the vapor delivery manifold; and the vapor delivery manifold connects the first vaporizer to the processing region; a plurality of heated zones; a heater in thermal contact with each of the heated zones; a thermocouple in thermal contact with each of the heated zones; and a plurality of temperature controllers, wherein one of the plurality of temperature controllers is in communication with each of the heaters and thermocouples to maintain the heated zones at a first target temperature.

Another embodiment of the apparatus includes: a chamber assembly including a chamber body, a chamber lid, and a processing region; a first vaporizer; a second vaporizer; a vapor delivery system connecting the first and second vaporizers to the processing region, the vapor delivery system including: a vapor delivery manifold wherein: the vapor delivery manifold is mounted on the chamber lid; the first and second vaporizers are mounted on the vapor delivery manifold; and the vapor delivery manifold connects the first and second vaporizers to the processing region; a plurality of heated zones; a heater in thermal contact with each of the heated zones; a thermocouple in thermal contact with each of the heated zones; and a plurality of temperature controllers, wherein one of the plurality of temperature controllers is in communication with each of the heaters and thermocouples to maintain the heated zones at a first target temperature.

An additional embodiment of the apparatus includes a double containment line for delivering a precursor to a chamber assembly, with the double containment line including: an outer tube including a first flexible section; an inner tube including a second flexible section, wherein the inner tube passes through the outer tube to create an annular space, and wherein the second flexible section is primarily within the first flexible section; a plurality of annular plugs that are positioned to enclose that portion of the annular space that lies between the first and second flexible sections to create an annular volume; and a gas, wherein the gas fills the annular volume and creates a pressure within the annular volume.

BRIEF DESCRIPTION OF THE SEVERAL VIEWS OF THE DRAWINGS

The foregoing and other aspects and advantages of the present invention will be better understood from the following detailed description of preferred embodiments of the invention with reference to the drawings, in which:

FIG. 4 is an expanded plan drawing of an embodiment of a liquid delivery system (LDS) housing of the present invention;

FIG. 5 is an assembly drawing of a section of an exhaust housing wall of the liquid delivery system of FIG. 4;

DETAILED DESCRIPTION OF THE INVENTION

Figure 1:
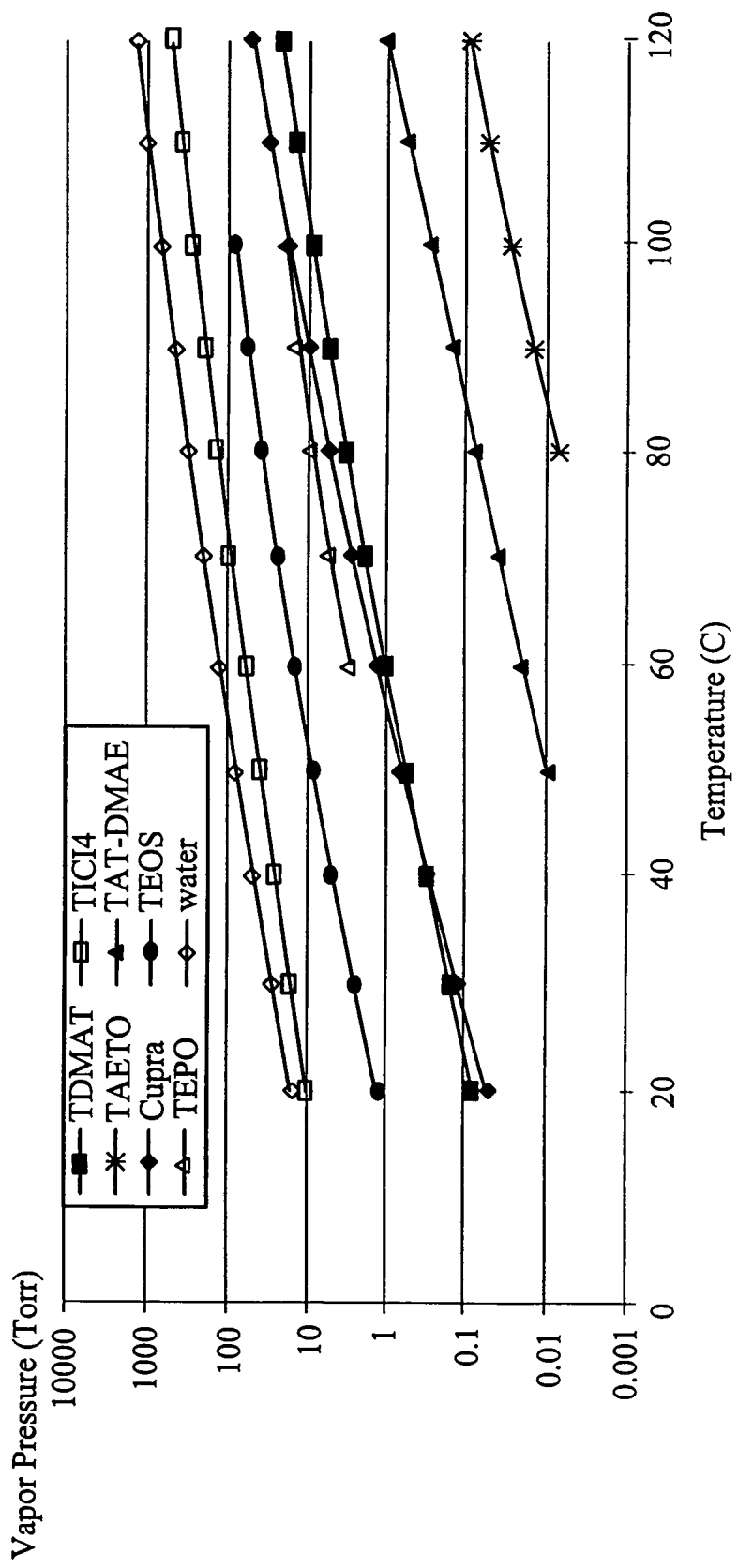
FIG. 1 is a graph of vapor pressure (Torr) vs. temperature (° C.) of various compositions.

The foregoing and other aspects and advantages will be better understood from the following detailed description of the preferred embodiments of the invention with reference to the drawings. Like reference numerals refer to corresponding parts throughout the drawings.

The present invention is directed to a novel liquid delivery system (LDS), chemical vapor deposition (CVD) chamber, exhaust system, and remote plasma generator that together comprise a unique system especially useful for depositing thin metal-oxide films, such as hafnium silicate, as well as other films requiring vaporization of low volatility precursor liquids. This system also provides for an in-situ cleaning process that removes the metal-oxide films that are deposited on the interior surfaces of a deposition chamber as a by-product of the deposition process. The system also has application in making ultra large scale integration (ULSI) DRAM and other advanced electronic devices that require the deposition of high dielectric constant materials. In general, devices that can be made with the system of the present invention are those devices that are characterized by having one or more layers of insulating, dielectric, or electrode material on a suitable substrate such as silicon. In addition to the previously mentioned High k materials, the system of the present invention can be used to deposit silicates, aluminates, N-doped silicates, plus other metal gate electrode materials. One skilled in the art will appreciate the ability to use alternatives to the disclosed configurations and process details of the present invention without departing from the scope of the present invention. In some instances, well known semiconductor processing equipment and methodologies have not been described to avoid obscuring the present invention.

Figure 2:
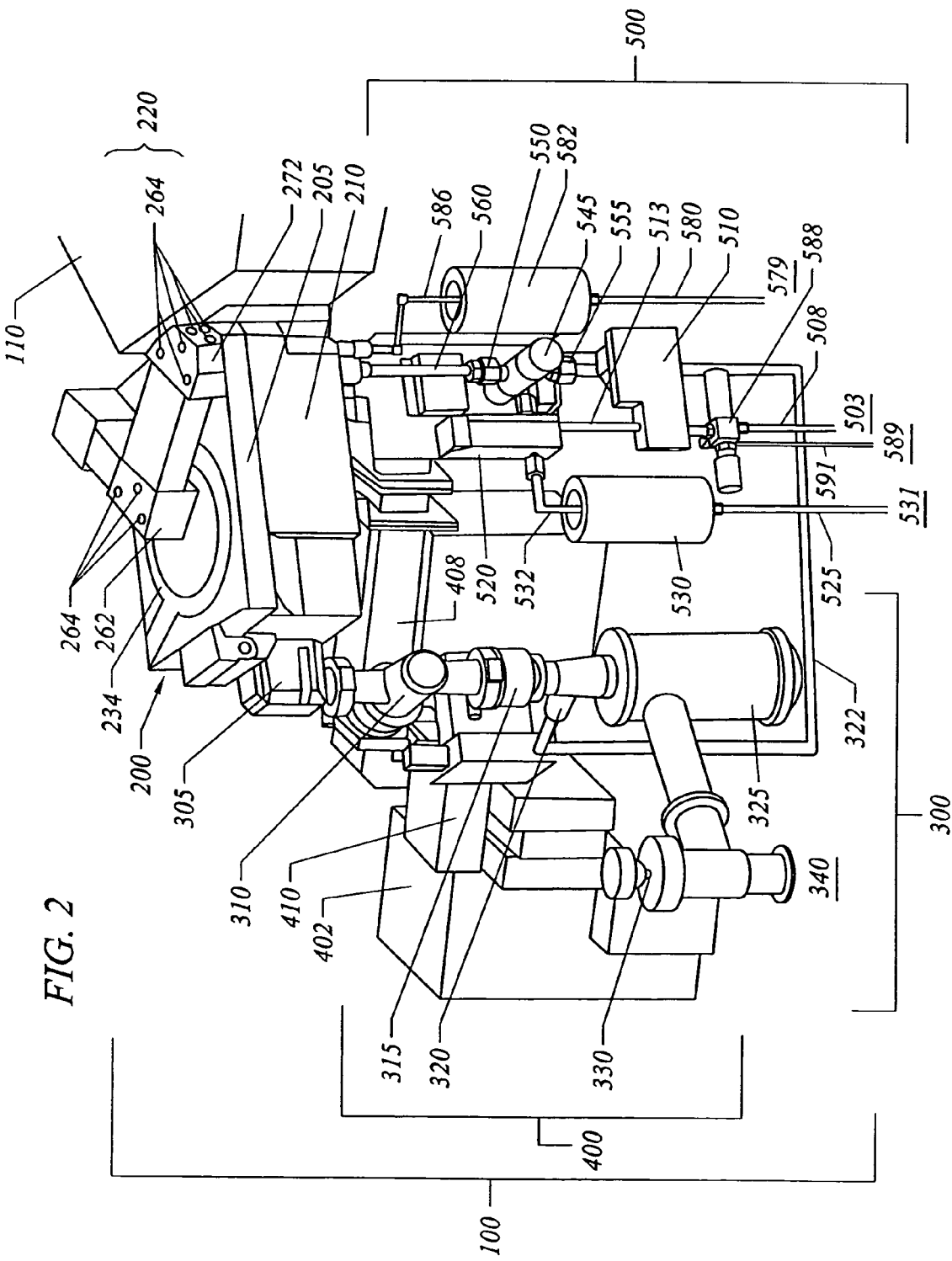
FIG. 2 is a perspective view of the processing system of the present invention.
Figure 21:
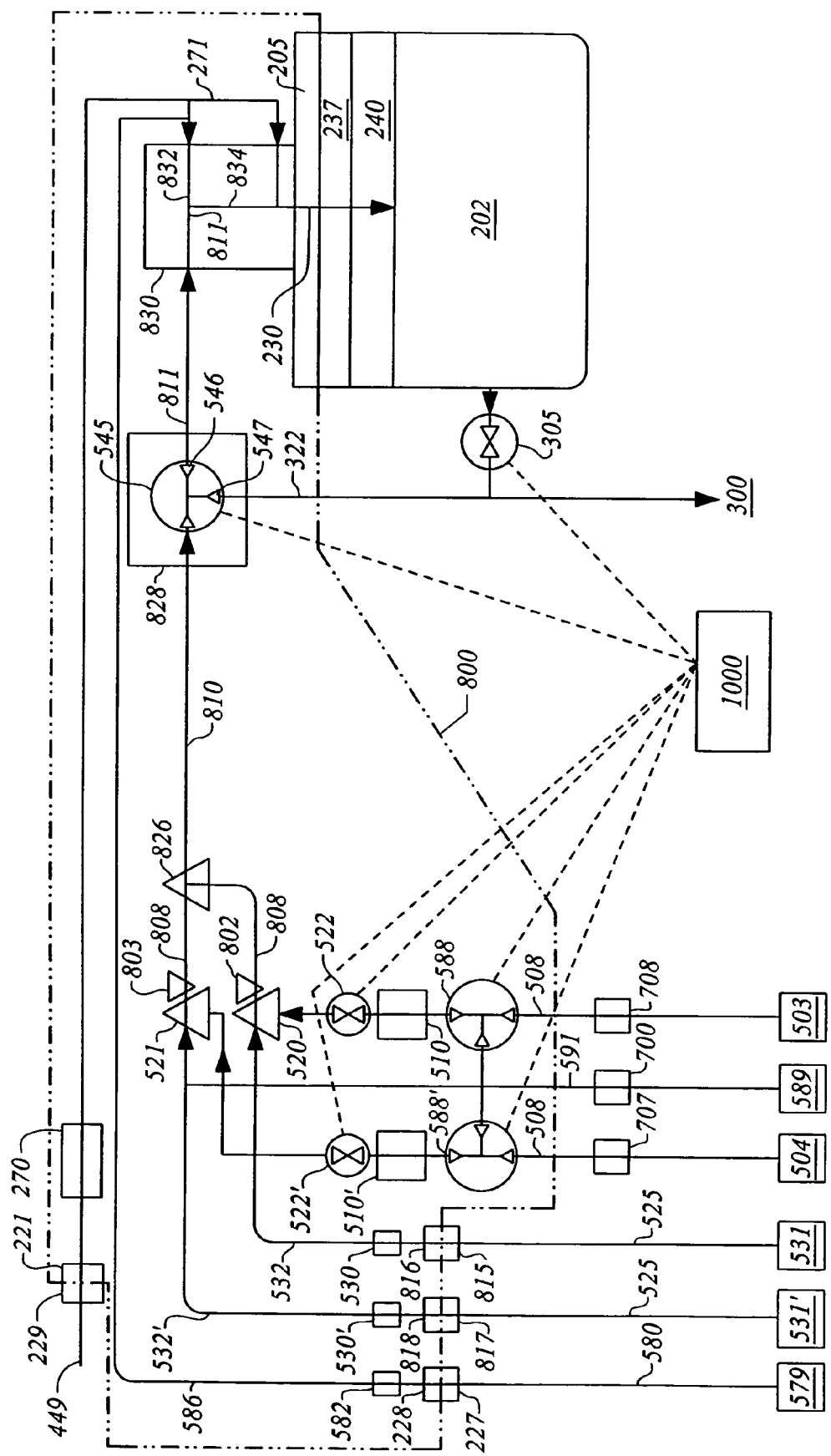
FIG. 21 is a schematic of an embodiment of the present invention with two vaporizers mounted on the chamber lid.

FIG. 2, which is a perspective view of the processing system of the present invention, shows the relative positions of the main components of the present invention. Processing system 100 contains a processing chamber assembly 200, a heated exhaust system 300, a remote plasma generator 400, a vapor delivery system 500, and an on-board software control system 1000 (FIG. 21). Also shown in FIG. 2 is a central substrate transfer chamber 110 representative of a cluster tool embodiment of the processing system of the present invention. Processing chamber assembly 200 comprises a lid 205 and a chamber body 210 and is attached to central transfer chamber 110. Vapors supplied via vapor delivery system 500 are provided into a processing region (not shown) within chamber assembly 200 via a heated feed-through assembly 220 that includes temperature controlled conduits formed within an inlet and mixing manifold 272 and a central mixing block 262. Cartridge heaters 264 are integrally formed into each block and, in conjunction with individual thermocouples and controllers, maintain temperature set-points within the conduits. During operation, these temperature set-points may be different for different conduits, blocks, and other chamber assembly components. For clarity, individual thermocouples and controllers have been omitted. Not visible in FIG. 2 but an aspect of the present invention is an embedded lid heater 235 (FIG. 6) integrated into chamber lid 205 beneath a heater clamping plate 234.

Processing by-products are exhausted from chamber assembly 200 via heated exhaust system 300 that is coupled to chamber assembly 200. Also shown are an isolation valve 310, a throttle valve 315, a chamber by-pass inlet 320, a cold trap 325, a cold trap isolation valve 330, and a wafer fabrication plant exhaust treatment system outlet 340 (or "foreline"). In order to provide a clearer representation of the interrelationship between and relative placement of each of the components of heated exhaust system 300, the jacket type heaters, thermocouples and controllers used to maintain set-point temperatures in exhaust port 305, isolation valve 310, throttle valve 315, chamber by-pass inlet 320, and a by-pass line 322 have been omitted.

Activated species for cleaning are generated by remote plasma generator 400 and provided to a processing region within chamber assembly 200 via conduits within heated plasma manifold 270, and central mixing block 262. Other components of remote plasma generator 400 such as magnetron 402, auto tuner controller 410, and auto tuner 408 are visible in FIG. 2.

The main components of vapor delivery system 500 include a liquid flow meter 510 and a vaporizer 520. Three-way inlet valve 588 introduces either a precursor from precursor supply lines 508 or a solvent from solvent delivery line 591 into vapor delivery system 500. Precursor from supply line 508 enters liquid flow meter 510, which regulates the precursor liquid that flows to vaporizer 520 through vaporizer supply line 513. Heat exchanger 530 and gas heater 582 preheat carrier (or "ballast") gases and process gases respectively. Carrier gases from carrier gas source 531 enter heat exchanger 530 and are heated, before they travel via a carrier gas supply line 532 to vaporizer 520, to facilitate more complete vaporization within vaporizer 520 as well as carry vaporized liquids to chamber assembly 200. After vaporizing precursor liquid in vaporizer 520, chamber by-pass valve 545 allows the vapor to be ported either to the processing region in chamber assembly 200 via chamber outlet 550 and heated feed-through line 560, or to exhaust system 300 via an outlet 555 and heated by-pass line 322. Process gases from process gas source 579 enter gas heater 582 and are heated before they travel via a process gas supply line 586 to chamber assembly 200.

The jacket style heater, thermocouple, and controller that maintain the temperature of chamber by-pass valve 545 and heated feed-through line 560 and the jacket style heater, thermocouple, and controller that maintain the temperature of by-pass line 322 have been omitted so as not to obscure the components of vapor delivery system 500 and their relationship to chamber assembly 200 and heated exhaust system 300.

The sizes and dimensions of the various components and the placement of these components in relation to each other are determined by the size of the substrate used in the processes of the present invention. A preferred embodiment of the invention will be described herein with reference to a processing system 100 adapted to process a circular substrate, such as a silicon wafer, having a 200 mm diameter. Although described in reference to a single substrate, one of ordinary skill in the art of semiconductor processing will appreciate that the methods and various embodiments of the present invention are adaptable to the processing of multiple substrates within a single chamber assembly 200.

Figure 3:
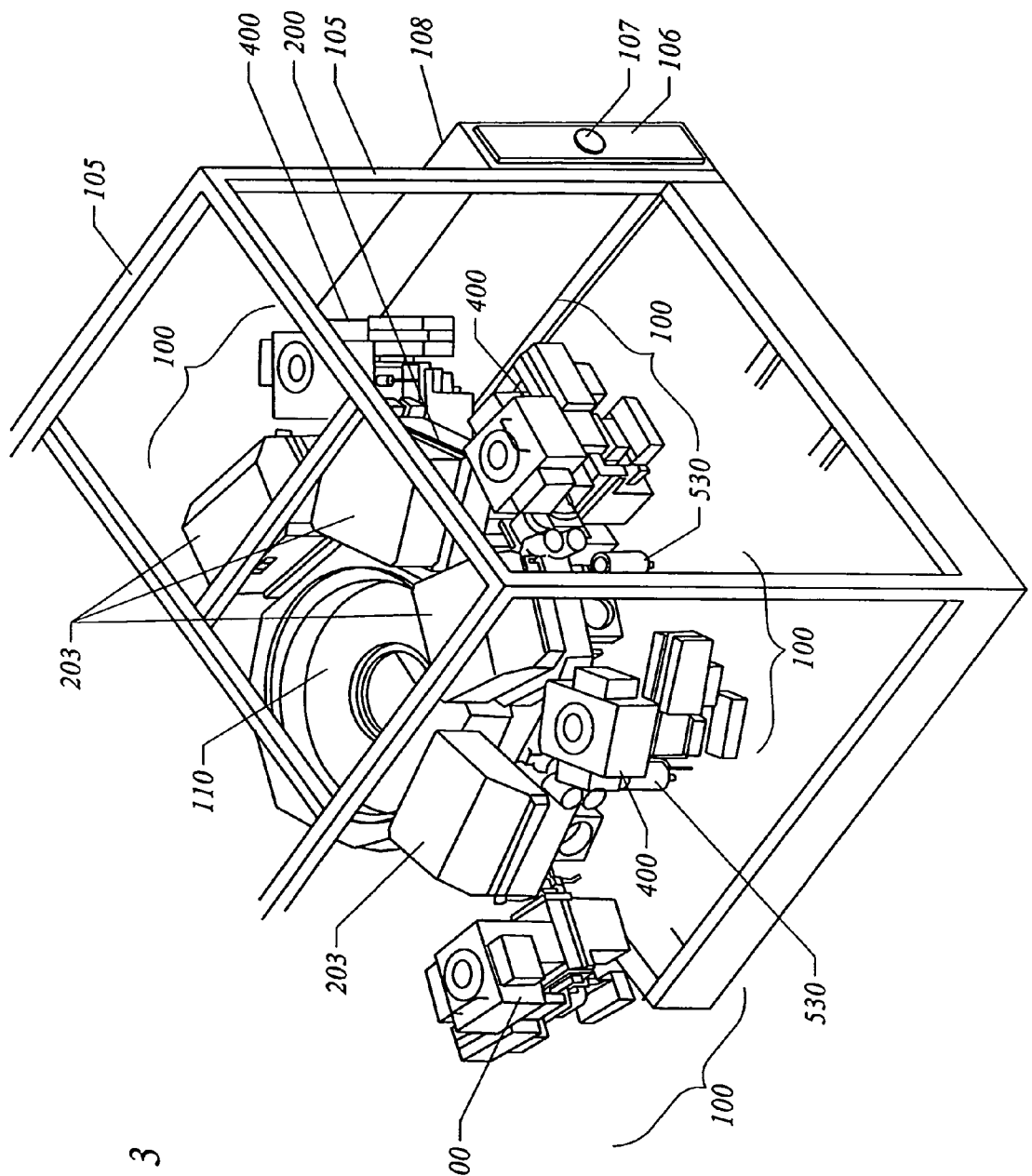
FIG. 3 is a perspective view of four representative processing systems of the present invention mounted on a typical central wafer handling system.

Turning now to FIG. 3, which is a perspective view of four representative processing systems of the present invention mounted on a typical central wafer handling system, a plurality of processing systems 100 are arranged in a cluster tool arrangement around central substrate transfer chamber 110 and supported by a mainframe 105. The Centura7 mainframe system, manufactured by Applied Materials, Inc. of Santa Clara, Calif., is representative of one such cluster tool arrangement. This arrangement allows multiple chambers, shown here comprising four processing systems 100 of the present invention, to connect to a common vacuum transfer chamber 110.

One advantage of such an arrangement is that the central substrate transfer chamber 110 also has attached to it a load-lock or loadlocks that hold a plurality of substrates for processing in chambers attached to the central substrate transfer chamber. Although FIG. 3 illustrates four identical processing systems 100, another advantage of the cluster tool arrangement is the ability to place a variety of chamber types onto a single central substrate transfer chamber 110. In such an arrangement, a substrate may move between chambers arranged around central substrate transfer chamber 110 without exposure to an air or oxygen ambient. Thus, it is a feature of the processing system 100 of the present invention that, with a variety of predetermined chamber types, a substrate could be loaded into the loadlock attached to central substrate transfer chamber 110, sequenced through the various chambers and, as a result of the sequencing, form predetermined and desired films on a substrate processed in this manner.

It is contemplated that processing system 100, in conjunction with other chamber types, is capable of forming complete portions of an IC. Specifically contemplated are the selections of chamber types, sequencing, and liquid delivery configurations that result in the formation of a stack capacitor having polysilicon bottom and top electrodes separated by silicon nitride and titanium nitride barrier layers that are separated by a tantalum oxide dielectric layer. Also specifically contemplated are the selections of chamber types, sequencing, and liquid delivery configurations that result in the formation of a High k transistor gate stack having an interfacial layer on the bottom interface, followed by a High k dielectric layer, followed by a post treatment, then followed by a gate electrode material. Other layers and structures are also contemplated and are intended to be included within the capabilities of the methods and apparatus described herein. It is also specifically contemplated that a single processing system 100 would alone have the processing capability of forming complete portions of an IC.

Each system 100 is shown with a cover 203 in place. Cover 203 encloses heated chamber lid 205 and temperature controlled central mixing block 262, inlet and mixing manifold 272, and heated plasma manifold 270 (FIG. 2). In one embodiment of the present invention, while chamber lid 205 is heated to operate at temperatures from 30° C. to 130° C., cover 203 is maintained at a relatively safe temperature to prevent burn injuries from contact with the heated components of lid 205.

Remote plasma generators 400 are also shown in an alternative embodiment in which each generator is supported from the top of mainframe 105 instead of from below as shown in FIG. 2. So as not to obstruct the view of this alternative embodiment of remote plasma generator 400, heated exhaust system 300 is not shown. Such a support arrangement of remote plasma generator 400 provides easier accessibility and maintenance of other components of processing system 100 as well as contributing to the reduction of the overall footprint of processing system 100. The embodiment of the plurality of processing systems 100 of FIG. 3 further illustrate the compact design features of the present invention. An additional aspect of compact design in this embodiment is that bulk storage containers and solvent containers are located in an on-board LDS housing 108 on mainframe 105. This reduces the liquid line length between containers and vaporizers allowing more precise control and repeatability of liquid delivery.

LDS housing 108 has an exhaust system that allows the user to tune the exhaust to desired flow rates at points within LDS housing 108. Now referring to FIG. 4, which is a drawing of an embodiment of a liquid delivery system (LDS) housing of the present invention (viewed facing housing doors 116), LDS housing 108 has on its left-hand side an exhaust port 107 that is attached to an exhaust line, typically house exhaust. Exhaust port 107 leads from an enclosed volume 104 created by an exhaust cover 106 and an exhaust housing wall 109. Exhaust cover 106 is shown transparently to reveal that exhaust housing wall 109 is fitted with a number of slotted plates 111 each covering a section of exhaust housing wall 109. LDS housing 108 has on its right-hand side a second exhaust housing wall 117 with another set of slotted plates 111.

Now referring to FIG. 5, which is an assembly drawing of a section of an exhaust housing wall of the liquid delivery system of FIG. 4, both exhaust housing walls 109, 117 have horizontal slots 112 and vertical slots 113 (shown as an enlarged section of housing walls 109, 117). Slotted plates 111 have horizontal slots 114 and bolt holes 115 (for clarity, only representative elements have been labeled in this Figure). Horizontal slots 114 on slotted plates 111 and horizontal slots 112 on housing walls 109, 117 are the same dimensions and are spaced so that all horizontal slots 114 may align with corresponding horizontal slots 112 when a slotted plate 111 is bolted to exhaust housing wall 109 or exhaust housing wall 117. Bolts 118 pass through bolt holes 115 and vertical slots 113 to attach slotted plate 111 to exhaust housing walls 109, 117. Vertical slots 113 allow each slotted plate 111 to be bolted between a raised position (at bolt position 119) or a lowered position (at bolt position 120) relative to exhaust housing wall 109 or 117. When bolted using bolt positions 119 (as shown), horizontal slots 114 are fully aligned with horizontal slots 112. When bolted using bolt positions 120, horizontal slots 114 do not align with horizontal slots 112 at all. Fully aligning a horizontal slot 114 with a horizontal slot 112 opens a passageway 121 through the combination of slotted plate 111 and exhaust housing wall 109 or 117. Bolting plate 111 at a position between bolt positions 119 and 120 creates a partial alignment of horizontal slots 114 and 112 and a partial opening of passageway 121.

"Tuning" LDS housing 108 means bolting slotted plates 111 in a position that opens passageways 121 a desired amount so that air may flow across arbitrary positions within LDS housing 108 at a desired velocity, once a vacuum is applied to enclosed volume 104. These arbitrary positions generally correspond to the locations of valves and other plumbing within LDS housing 108 that can leak noxious materials. Tuning LDS housing results in air flowing past these valves and plumbing at a velocity that would draw escaping noxious fumes into the house exhaust. For each slotted plate 111, maximum air may flow when horizontal slots 114 are aligned with horizontal slots 112 creating passageways 121. Conversely, minimum exhaust may flow when horizontal slots 114 are not aligned with horizontal slots 112 at all and passageways 121 are closed. Partially aligning slots 114 and 112 partially opens passageways 121 and controls the flow through passageways 121.

During tuning, LDS housing 108 is fitted with air velocity sensors (not shown) at the desired locations within LDS housing 108. Exhaust port 107 is connected to house exhaust, which creates a vacuum within enclosed volume 104. Opening passageways 121 in exhaust housing walls 109 and 117 causes air to flow through the main section of LDS housing 108 and into the exhaust. The air flow at each of the desired locations is monitored and adjusted by adjusting the air flow through the appropriate slotted plate 111, or multiple slotted plates 111, which could include plates on either or both of exhaust housing walls 109, 117. Although LDS housing 108 is shown with slotted plates 111 on opposing walls 109, 117, it should be understood that the invention could be practiced with the slotted plates on different walls and in differently-shaped housings.

Figure 24:
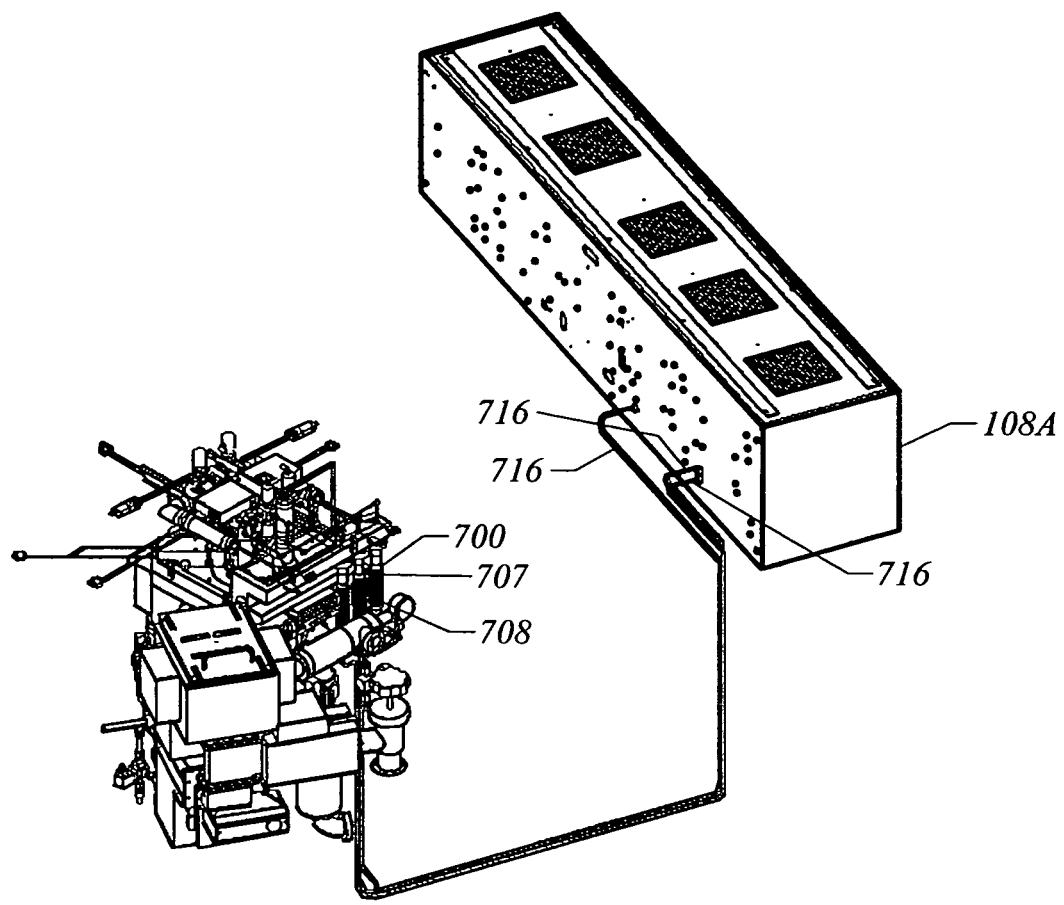
FIG. 24 is a perspective view of an embodiment of the flexible double containment lines connected to and LDS housing.

Referring briefly to FIG. 24, one embodiment of the invention employs an LDS housing 108A that does not have the tunable exhaust feature of LDS housing 108 (FIG. 3). In this particular embodiment of the invention, LDS housing 108A is attached to mainframe 105 (FIG. 3) in the same manner as LDS housing 108 (FIG. 3). LDS housing 108A is dimensioned to contain four bulk storage containers and one bulk solvent container. Precursor supply lines and solvent supply lines connect the bulk storage containers and bulk solvent container to vaporizer assemblies on any of the processing systems 100 (FIG. 3) attached to mainframe 105. For clarity, FIG. 24 shows an example with precursor supply lines 508, 508' and solvent supply line 591 connecting the containers (not shown) within LDS 108A to processing system 100. Typically, LDS 108A is within ten feet of the attached processing system 100.

LDS housing 108 also has a magnetic proximity switch (not shown) that monitors whether housing doors 116 are closed, as part of an interlock system. When housing doors 116 are not closed, the interlock system de-energizes the gas and precursor supply valves. Also, as part of the interlock system, a sensor (not shown) monitors airflow through exhaust port 107 and the system de-energizes the gas and precursor control valves in the LDS housing 108 and the vaporizers should the flow be too low. These interlocks are listed in Table I, below.

Figure 6:
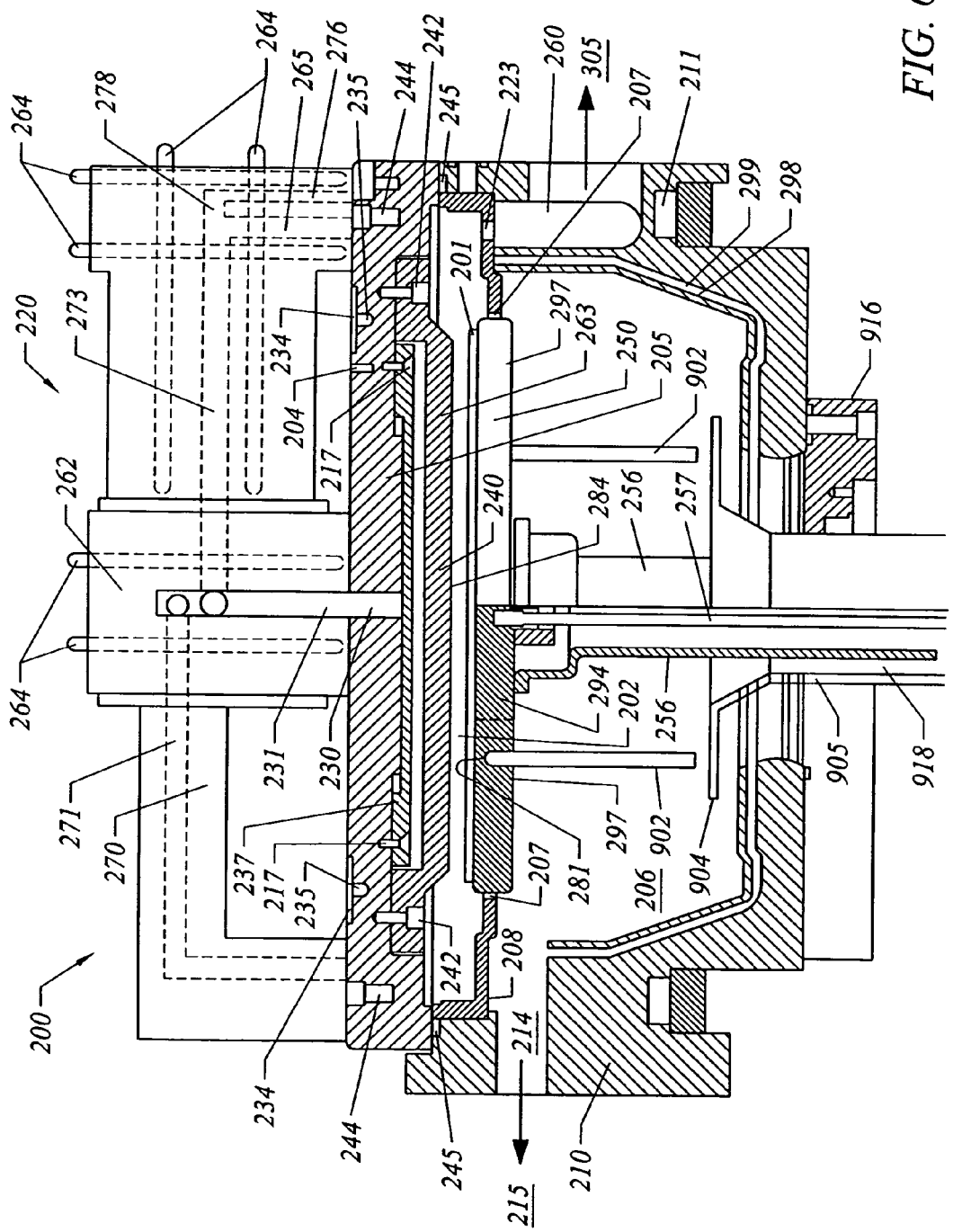
FIG. 6 is a cross-sectional view of a processing chamber of the present invention.

FIG. 6 is a cross-sectional view of chamber assembly 200 of processing system 100 of FIG. 2. Heated chamber lid 205 is hinged to chamber body 210. Together with O-ring 245 these form a temperature and pressure controlled environment or processing region 202 for performing deposition processes and other operations. Chamber body 210 and lid 205 are preferably made of a rigid material such as aluminum, various nickel alloys, or other materials having good thermal conductivity. O-ring 245 is formed from a chemical resistant elastomer, perfluoroelastomer, or rubber, such as Chemraz®, Kalrez®, or Viton®, respectively, or other suitable sealing material specifically designed for use in fluid seals.

When lid 205 is closed as shown in FIG. 6, a processing region 202 is formed that is bounded by a showerhead 240, a pumping plate 208, a pedestal heater 250, and chamber lid 205. Pedestal heater 250 (shown in the raised position for processing) is supported by heater shaft 256, which extends through the bottom of chamber body 210. Heater shaft 256 is welded to pedestal heater 250 and they move as one. Imbedded within pedestal heater 250 is a resistive heater that receives power via a resistive heating element electrical connector 257. A thermocouple in thermal contact with pedestal heater 250 senses the temperature of pedestal heater 250 and is part of a closed loop control circuit that allows precise temperature control of pedestal heater 250. A substrate 201 is supported by the upper surface of pedestal heater 250 and is heated by the resistive heaters within pedestal heater 250 to processing temperatures of, for example, between about 400° C. and 500° C. for tantalum films formed using the methods and apparatus of the present invention. In one embodiment pedestal heater 250 is made of a ceramic material and is capable of attaining temperatures of from 200° C. to 600° C. Substrate 201 can be a substrate used in the manufacture of semiconductor products such as silicon substrates and gallium arsenide substrates and can be other substrates used for other purposes such as substrates used in the production of flat panel displays. Pedestal heater 250 and substrate 201 are parallel to showerhead 240.

In an embodiment of the present invention, two sets of resistive heaters are imbedded within pedestal heater 250 in a manner that divides pedestal heater 250 into two heated areas. These heated areas are annular, allowing control of an outside area 297 and an inside area 294 of pedestal heater 250. Thermocouples are arranged within inside area 294 and outside area 297 to sense the temperatures of these areas and are part of two closed loop control circuits that allow for more precise overall temperature control of pedestal heater 250. In an embodiment of the invention, inner area 294 is heated to a percentage of outside area 297 with a single thermocouple, set in inner area 294, used to control the temperature. One of ordinary skill will appreciate that the present invention encompasses alternative embodiments in which multiple continuous or discontinuous embedded heaters are arranged within pedestal heater 250 to provide additional heat or greater temperature control.

Processing chamber assembly 200 is coupled to central transfer chamber 110 via an opening 214. A slit valve 215 seals processing region 202 and an enclosed volume 206 from central transfer chamber 110. Pedestal heater 250 may also move vertically below opening 214 so that, when slit valve 215 is open, a substrate may be moved between the processing region 202 and central substrate transfer chamber 110.

Figure 7:
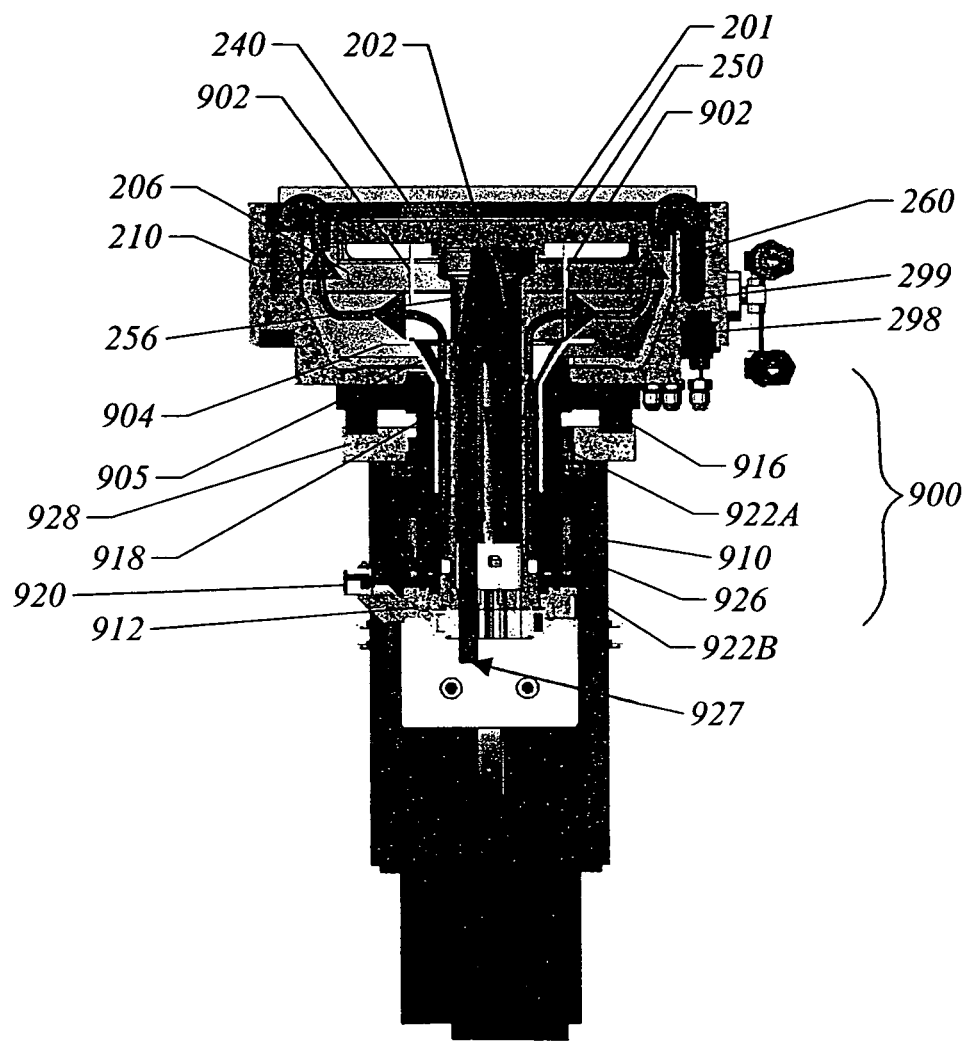
FIG. 7 is a cross-sectional view of a lift mechanism and the lower half of a processing chamber of the present invention.
Figure 8:
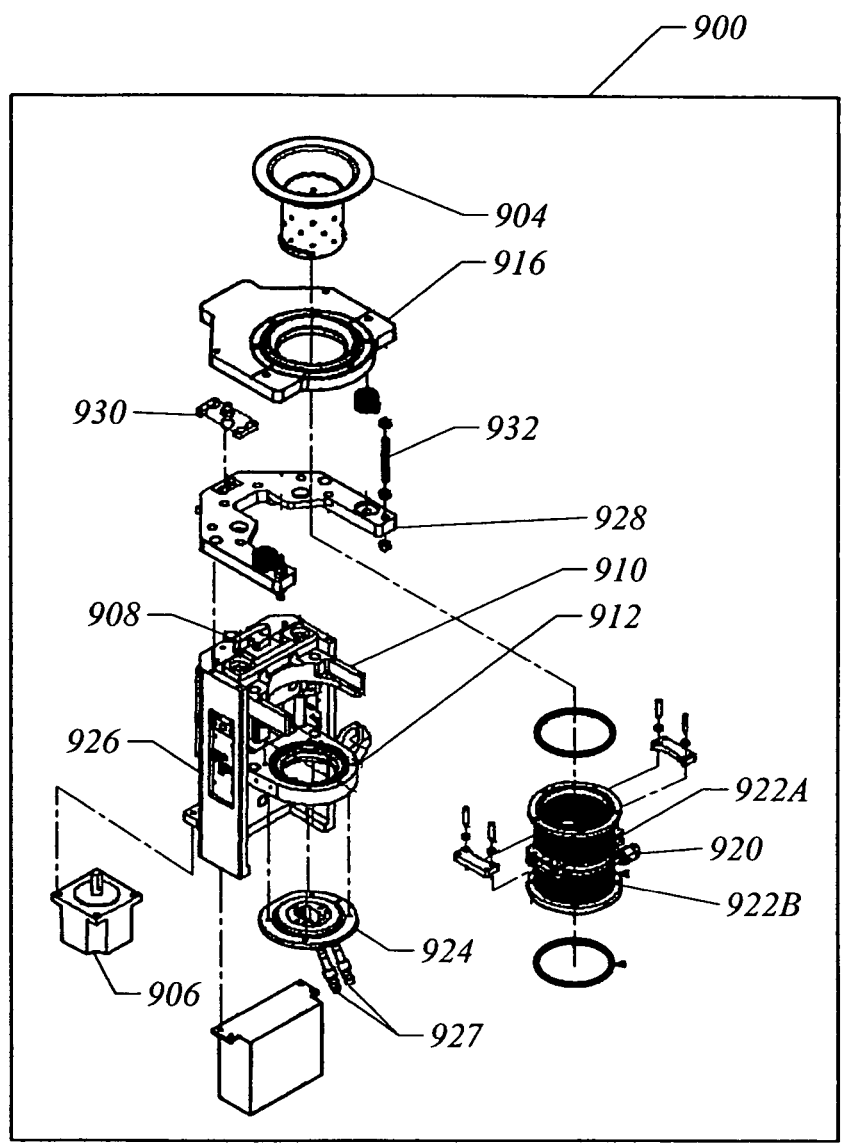
FIG. 8 is an assembly drawing of the lift mechanism of FIG. 7.

FIG. 7, which is a cross-sectional view of a lift mechanism and the lower half of a processing chamber of the present invention, and FIG. 8, which is an assembly drawing of the lift mechanism of FIG. 7, describe lift assembly 900. Lift assembly 900 moves pedestal heater 250, and therefore substrate 201, into a specific position within chamber assembly 200 in relation to showerhead 240. Lift assembly also creates an annular space 918 that allows an inert purge gas to be passed from lift assembly 900 into enclosed volume 206 to pressurize enclosed volume 206 and prevent vapor from passing from processing region 202 into enclosed volume 206.

Briefly referring to FIG. 6, lift assembly 900 includes four lift pins 902, which move in evenly spaced holes 281 in pedestal heater 250 about heater shaft 256 (two lift pins are not shown for clarity). Lift pins 902 interact with a lift plate 904 that attaches to an upper carrier 910 (FIG. 7) by way of a lift tube 905. Lift plate 904 is made of aluminum with four ceramic buttons (not shown) for contacting ceramic lift pins 902. When in contact with lift plate 904, lift pins 902 slide vertically within holes 281 due to relative movement between pedestal heater 250 and lift plate 904. At some point when lowering lift plate 904 this relative movement causes lift pins 902 to retract below the surface of pedestal heater 250 and causes lift plate 904 to lose contact with lift pins 902. Pedestal heater 250 then mechanically retains lift pins 902 by means known to one of ordinary skill in the art.

Returning to FIG. 7, lift plate 904, lift tube 905, and heater shaft 256 move axially within a bellows assembly. The bellows assembly includes an upper bellows 922A and a lower bellows 922B. Heater shaft 256 is supported by a lower carrier 912. A motor 906 (FIG. 8) moves lower carrier 912 through a lead screw drive shaft 908 (FIG. 8) and a precision ground nut (not shown), which could also be a ball nut. Lower bellows 922B seals against lower carrier 912 and upper carrier 910. Upper bellows seals against upper carrier 910 and chamber mounting plate 916. This, in combination with heater shaft 256 creates an annular space 918. Annular space 918 provides a passage that conducts a purge gas from a gas inlet 920 into enclosed volume 206. Lift tube 905 is within annular space 918 and is perforated to allow the purge gas to flow between lift tube 905 and upper bellows 922A.

Now referring briefly to FIG. 8, heater shaft 256 is sealed by a heater connector 924 that is provided with gas fittings 927. A purge gas is introduced into the interior of heater shaft 256 through one of gas fittings 927 and exits through the other gas fitting 927. Nitrogen is commonly used as the purge gas, but other purge gasses are known in the art. Upper and lower carriers 910, 912, lead screw drive shaft 908, and motor 906 are supported by a lift housing 926. Lift housing 926 is attached to chamber mounting plate 916 through a heater lift leveling plate 928. Heater lift leveling plate 928 has a pivoting connection 930 to chamber mounting plate 916 and two adjustable connections 932. Adjustable connections 932 level pedestal heater 250 to shower head 240.

Returning to FIG. 7, during processing, lift pins 902 are retracted below or even with the surface of pedestal heater 250. To transfer substrate 201 out of the process chamber, lower carrier 912 lowers heater shaft 256, which in turn lowers pedestal heater 250 from the process position in relative proximity to showerhead 240 to the transfer position where the surface of pedestal heater 250 is below opening 214. As pedestal heater 250 lowers, lift pins 902 contact with lift plate 904. With continued lowering, lift pins 902 begin to protrude above the surface of pedestal heater 250. As they protrude, pins 902 lift substrate 201 off pedestal heater 250 a certain distance after which pedestal heater 250 and lift plate 904 move in unison until pedestal heater 250 is properly aligned with opening 214.

To transfer a substrate into the process chamber, the reverse occurs and lift pins 902 rise with pedestal heater 250 to lift substrate 201 off a robot blade (not shown) that has entered via opening 214. The lift mechanism pauses and the blade then retracts. Pedestal heater 250 then raises substrate 201 to the programmed process position. During this raise, pedestal heater 250 and lift plate 904 move in tandem a certain distance, then lift plate 904 ceases moving while pedestal heater 250 continues upward. The relative motion between lift plate 904 and pedestal heater 250 causes lift pins 902 to retract within pedestal heater 250 until lift pins 902 no longer contact lift plate 904. Pedestal heater 250 continues moving until properly positioned.

The relative movement between lift plate 904 and pedestal heater 250 is determined by upper and lower carriers 910, 912. As discussed, upper carrier 910 supports lift plate 904 and lower carrier 912 supports pedestal heater 250 through heater shaft 256. Upper carrier 910 is biased by springs (not shown) within lift housing 926 to remain against a hard stop (not shown) until engaged by lower carrier 912 as the lower carrier descends. Upper carrier 910 and lower carrier 912 then travel in unison until pedestal heater 250 reaches the release position.

During the upward motion, upper carrier 910 is first pulled up by spring force and restrained by the upward motion of lower carrier 912. Upper carrier 910 stops when it contacts a hard stop (not shown). Lower carrier 912 continues to travel upward along with pedestal heater 250. This causes a relative motion between lift pins 902 and pedestal heater 250 with the lift pins receding within the support until they lose contact with lift plate 904. At the point lift pins 902 lose contact with lift plate 904, they are recessed within pedestal heater 250. The position of pedestal heater 250 is adjusted to space substrate 201 within a range of approximately 0.300" to 1.000" from showerhead 240.

In one embodiment of the invention, a chamber liner 298 is situated within chamber body 210 and dimensioned to provide a gap 299 between chamber liner 298 and chamber body 210. Gap 299 thermally isolates chamber liner 298 from chamber body 210. Chamber liner 298 remains at a higher temperature than chamber body 210 during processing because chamber body 210 is in contact with the cooler external ambient atmosphere. Consequently, less condensate forms on chamber liner 298 than on chamber body 210. Less condensate also forms on chamber body 210 since much of it is shielded from the majority of vapor within processing region 202 by chamber liner 298. Additionally, the small size of gap 299 and lack of forced flow from processing region 202 into gap 299 reduces the amount of material that diffuses through gap 299 during processing and thereby reduces the amount of condensate that may form on chamber body 210. An additional advantage of this arrangement is that chamber liner 298 may be removed for cleaning or replacement and chamber body 210 need not be cleaned as much, resulting in less wear and increasing the useful life of chamber body 210. In one embodiment of the invention, gap 299 is approximately 0.100" wide, although chamber liner 298 does occasionally come into contact with chamber body 210 to fix chamber liner 298 into position with chamber body 210.

Returning to FIG. 6, when slit valve 215 is closed and pedestal heater 250 is in the raised position for processing, processing region 202 is separated by pedestal heater 250 from enclosed volume 206. During processing, gap 207 allows material to pass into enclosed volume 206. This loss is undesirable since it reduces the efficiency of the deposition process and leads to this material condensing on chamber body 210 and chamber liner 298. To prevent this, enclosed volume 206 is kept at a pressure greater than processing region 202 by introducing an inert gas such as nitrogen into enclosed volume 206 via gas inlet 920 (FIG. 7). The inert gas flows through annular space 918 (FIG. 7), enclosed volume 206, gap 207, pumping passage 223, to pumping channel 260, through chamber exhaust port 305, and is collected by the heated exhaust system 300. In one embodiment of the invention the inert gas flows from pumping channel 260 directly to isolation valve 310. Pressure transducers (not shown) monitor the pressures in enclosed volume 206 and processing region 202. Pedestal heater 250 is sometimes called a "lift" and this feature of having a greater pressure below the lift is sometimes called a "lift purge." The pressure differential from enclosed volume 206 to processing region 202 reduces material flow from processing region 202 into enclosed volume 206, reduces maintenance, and improves deposition efficiency. The pressure monitors are interlocked to de-energize the gas control valves, heaters, and chamber as listed in Table I, below.

In an embodiment of the invention, a heating channel 211 is provided within chamber body 210. A heated fluid, such as water or glycol, is passed through heating channel 211 to raise the temperature of chamber body 210. This results in less condensation on chamber body 210 with the advantages discussed above. In one embodiment, chamber body 210 is heated to operate at temperatures of from 30° C. to 105° C. using water and a Steelhead 37, manufactured by Neslabs. The water circulated within heating channel 211 is commonly 90° C. Also, mixing block 262, manifold 272, and heated feed-through line 560 are heated to operate at temperatures of from 30° C. to 230° C., and pedestal heater 250 is heated to temperatures of between 200-600° C. In this embodiment there are sixteen independently controlled temperature zones with safety overtemperature interlocks downstream of the vaporizers.

Pumping passage 223 and pumping channel 260 are formed within chamber body 210 for removing by-products of processing operations conducted within processing region 202. Pumping channel 260 provides fluid and gas communication between components of heated exhaust system 300 and processing region 202.

Turning now to the gas delivery features of chamber assembly 200, the process gas/precursor mixture from vapor delivery system 500 and activated species from remote plasma generator 400 are delivered via temperature controlled conduits 273 and 271, respectively, to a central conduit 231 and a central lid bore-through 230 formed in lid 205. From there, gases and activated species flow through blocker plate 237 and showerhead 240 into processing region 202.

Temperature controlled conduits 271 and 273 are formed integral to heated feed-through assembly 220 comprising central mixing block 262 and inlet and mixing manifold 272. Although the embodiment represented in chamber assembly 200 of FIG. 6 indicates a heated feed-through assembly 220 comprising block 262 and manifold 272, one of ordinary skill will appreciate that the block and manifold can be combined into a single block without departing from the spirit of the present invention. A plurality of cartridge heaters 264 are disposed internally to block 262 and manifold 272 and proximally to the conduits 231, 273, 278, 265, and 276. Cartridge heaters 264 maintain a set-point in each conduit utilizing separate controllers and thermocouples for the heater of a particular conduit. For clarity, the separate thermocouples and controllers have been omitted.

Lid 205 is also provided with an annular channel 244 that circulates cooling water within that portion of lid 205 in proximity to O-ring 245. Channel 244 is connected to heating channel 211 so that the same fluid circulates through each. Channel 244 allows the majority of lid 205 to maintain the temperatures preferred for advantageous heating of showerhead 240 while protecting O-ring 245 from higher temperatures that degrade the sealing qualities of O-ring 245. This protection is desired because, when degraded, O-ring 245 is more susceptible to attack by the reactive species generated and supplied to processing region 202 by remote plasma generator 400. A flow meter (not shown) monitors the flow through channel 244 and is interlocked to de-energize the water heater and other heater controllers should the flow be too low, as listed in Table I.

Another feature of processing chamber assembly 200 of the present invention also shown in FIG. 6 is an annular resistive heater 235 embedded within chamber lid 205. This feature of chamber assembly 200 provides elevated temperatures in lid 205 in proximity to both central lid bore-through 230, showerhead 240, and the area between the lower surface of the lid 205 and showerhead upper surface 263. Formed within the top surface of lid 205 is an annular groove shaped according to the size and shape of heater 235 in order to increase surface contact and heat transfer between heater 235 and chamber lid 205. A clamping plate 234 is secured in this groove by fasteners 243 (see FIG. 9) to help increase the surface area contact between embedded heater 235 and lid 205, thereby improving the efficiency of heat transfer between heater 235 and lid 205.

Without heater 235, channel 244 could continuously remove heat from chamber lid 205. This would lower the temperature of portions of lid 205, particularly those in contact with precursor vapor, such as the area surrounding central lid bore-through 230 and the showerhead upper surface 263. While cooler lid temperatures improve conditions for O-ring 245, cooler lid temperatures could result in undesired condensation of precursor vapor. Thus, heater 235 is positioned to heat those portions of lid 205 in contact with the vaporized precursor flow. As shown in FIG. 6, for example, heater 235 is located between channel 244 and central lid bore-through 230 while also positioned to provide heating to the lid surface adjacent to blocker plate 237.

Figure 9:
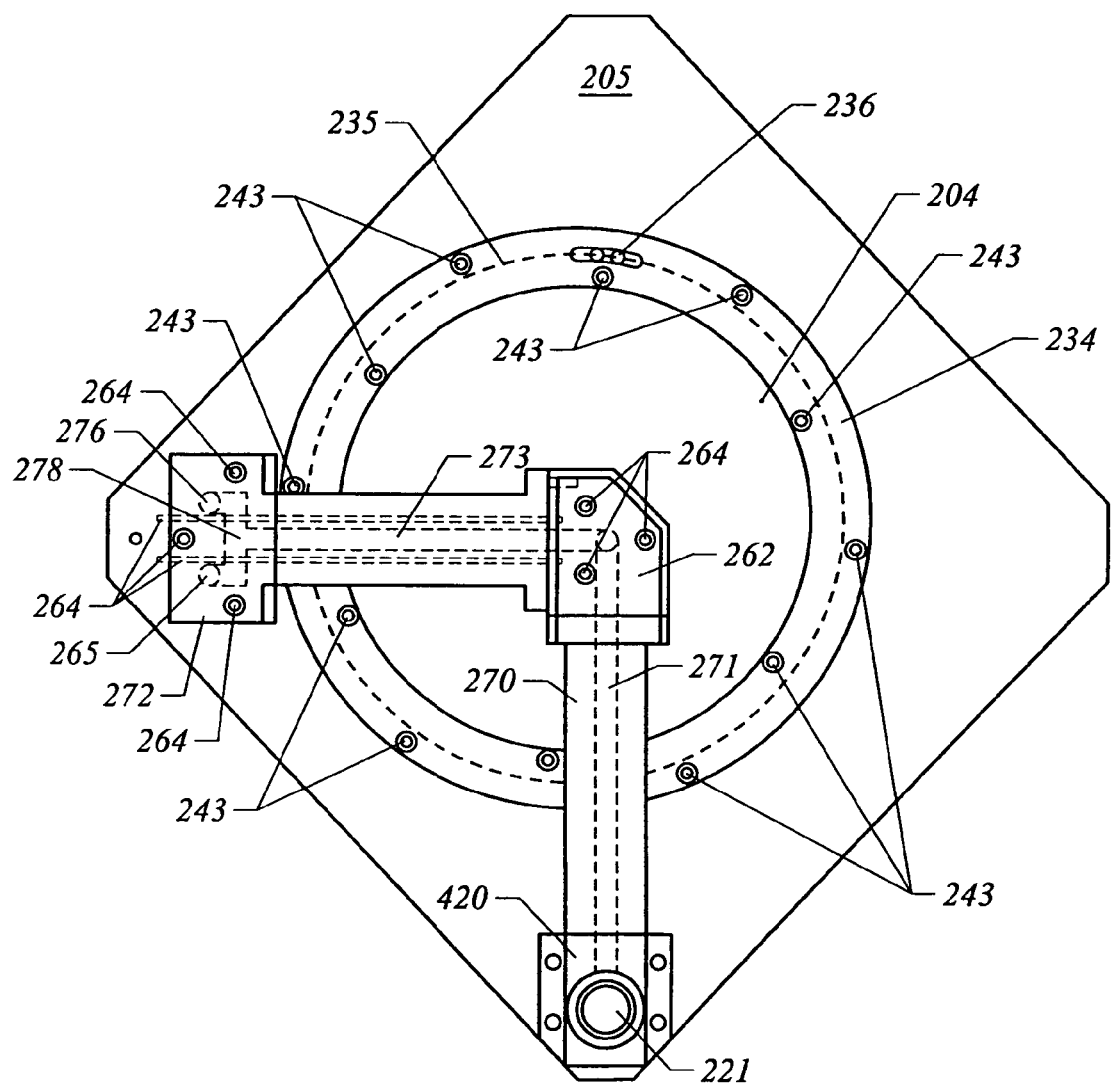
FIG. 9 is a plan view of the lid of the present invention.

Referring now to FIG. 9, which is a top view of the lid of the present invention, the relationship of heater 235 to other components mounted on lid 205 can be better appreciated. Embedded heater 235 is indicated in phantom and is located beneath clamping plate 234 and electrical connections 236. Lid 205 also has an embedded thermocouple 204 for monitoring the temperature within lid 205 in proximity to heater 235. Thermocouple 204 is part of a feedback control circuit that monitors and controls the power supplied to heater 235 to obtain a set-point temperature within lid 205. Precise temperature control is desired in lid 205, as in all components in contact with vaporized precursor gases, to provide conditions that neither condense nor decompose low vapor pressure precursors.

For a representative 200 mm embodiment of chamber assembly 200 shown in FIG. 6, heater 235 could have a 900 W output rating and is commercially available from a variety of commercial sources such as Watlow, Inc. of Richmond, Ill. Temperature set-points between about 80° C. and 180° C. are readily obtained in lid 205 utilizing a heater rated at about 650 Watts. It will be appreciated that various heater ratings, set-points, and configurations could be utilized to obtain a wide range of temperature set-points depending upon the decomposition and condensation temperatures and other characteristics of the precursor material used. Although heater 235 is represented by a single, continuous, circular element, one of ordinary skill will appreciate that alternative embodiments wherein a plurality of continuous or discontinuous embedded heaters 235 are arranged within lid 205 to provide additional heat or greater temperature control are within the scope of the present invention.

Referring again to FIG. 6, heated lid 205 provides support for showerhead 240 and blocker plate 237. As such, showerhead 240 is attached to lid 205 via a plurality of evenly spaced fasteners 242 and blocker plate 237 is attached to lid 205 by a plurality of evenly spaced fasteners 217. Fasteners 217 and 242 are formed from a rigid material such as aluminum, varieties of nickel alloys, and other materials having good thermal conductivity. Fasteners 242 and 217 have been advantageously placed to provide clamping force to increase contact between heated lid 205 and showerhead 240 in the case of fasteners 242 and heated lid 205 and blocker plate 237 in the case of fasteners 217. Increased contact area produces greater heat transfer between heated lid 205, blocker plate 237, and showerhead 240. Increased contact area also provides a better seal against gas leaks.

Figure 10:
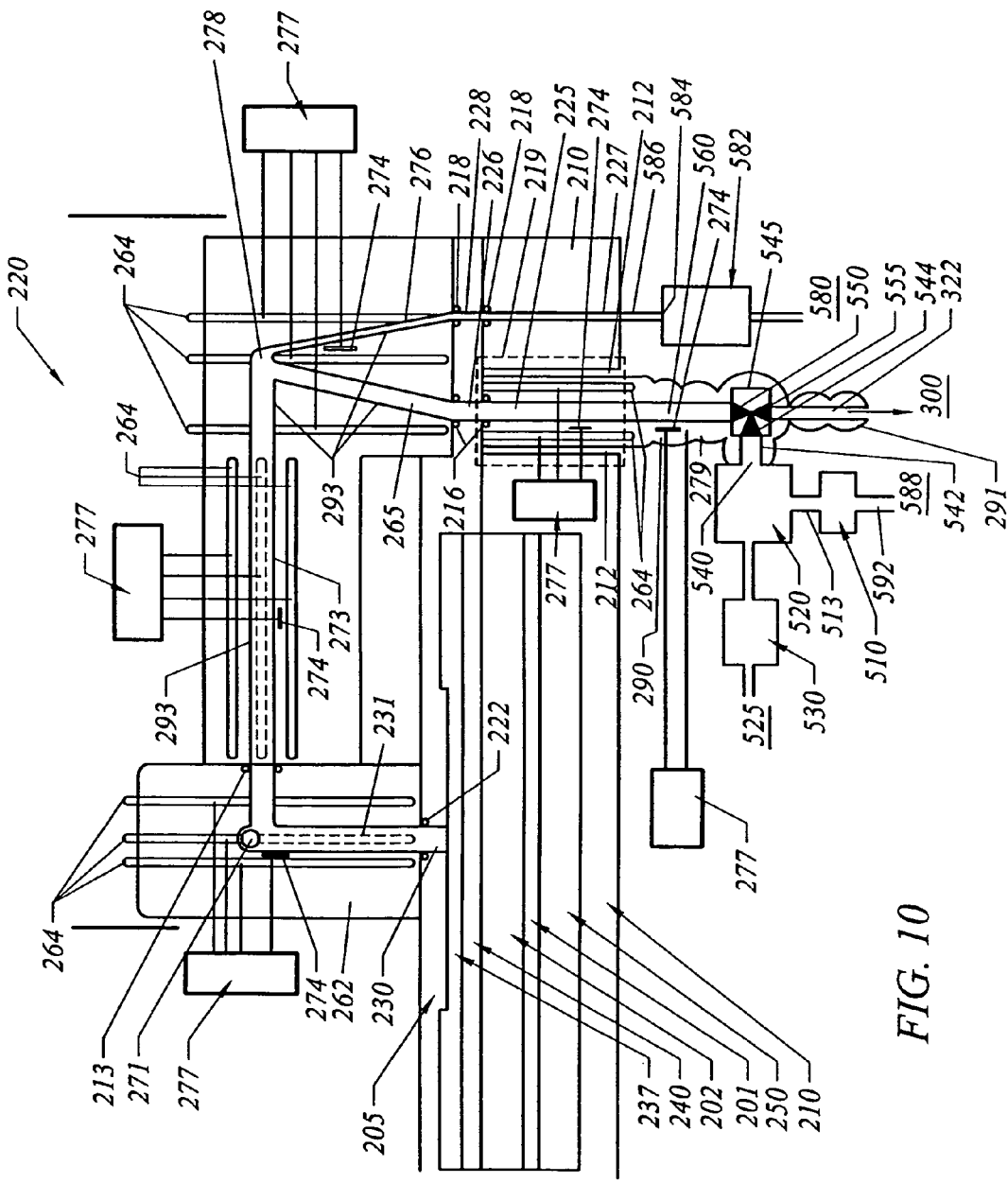
FIG. 10 is a schematic of an embodiment of the chamber assembly of the present invention.

Referring now to FIG. 10, which is a schematic of an embodiment of the chamber assembly of the present invention, specific aspects of the temperature controlled conduits of chamber assembly 200 of the present invention can be more fully appreciated. In particularly, one feature of the vapor delivery system of the present invention is represented by the continuous, independently temperature controlled conduits that couple the outlet of vaporizer 520 to processing region 202. Given the low vapor pressure of the tantalum and hafnium precursors, another feature of the vapor delivery system is the shortened vapor flow path from vaporizer 520 to processing region 202. Shortening the precursor vapor flow path reduces pumping losses, friction losses, and other fluid dynamic inefficiencies associated with the length of the pumping conduit as well as the inherent difficulties of pumping low vapor pressure gases. The reduction of the above fluid losses is also beneficial to the effective vaporization and delivery of low vapor pressure precursors according to the present invention because, as a result of minimizing the precursor flow path, the vapor delivery system is able to attain more stable and repeatable vapor flow rates for low vapor pressure precursors. In FIG. 10, for clarity, the schematic contains less detail regarding certain parts of the interior of the chamber assembly, more specifically from central lid bore-through to the pedestal heater 250.

Heated feed-through assembly 220, which includes inlet and mixing manifold 272 and central mixing block 262, is formed from rigid materials such as aluminum, varieties of nickel alloys, or other materials having good thermal conductivity. The various conduits formed within heated feed-through assembly 220 couple the outlets of heated chamber feed-through 225 and process gas chamber feed-through 227 and lid bore-throughs 226 and 228 to central lid bore-through 230.

Inlet and mixing manifold 272 attaches to lid 205 forming a sealed, continuous flow path between a precursor lid bore-through 226 and precursor inlet conduit 265 and between process gas lid bore-through 228 and process gas inlet conduit 276.

O-rings 216, 218, formed from a chemical resistant elastomer, perfluoroelastomer, or rubber for use in fluid seals, such as Chemraz®, or Kalrez®, or Viton® are used at lid bore-through outlets 226 and 228, respectively, to provide a seal at the mating surfaces between lid 205 and inlet and mixing manifold 272 and to seal at the mating surfaces between lid 205 and chamber body 210. Mixing conduit 278 includes the area where the process gas and precursor vapor begin to merge into a homogeneous mixture that is eventually delivered into processing region 202. The total conduit length from the beginning of mixing conduit 278 to processing region 202 is sufficiently long such that the resulting vapor/gas stream is homogeneously mixed upon arrival in central lid bore-through 230. Although the specific lengths needed to achieve homogeneous mixing will vary depending on a variety of factors such as the diameter of the conduit and gas flow rates and temperatures, a representative length from the beginning of mixing conduit 278 to central lid bore-through 230 would be about 9 inches for 0.5 inch inner diameter mixing conduit 278, mixed deposition gas conduit 273, central conduit 231, and central lid bore-through 230. In an alternative example, the length of conduit that could also result in homogeneous mixing of precursor vapor and process gases from mixing conduit 278 through mixed deposition gas conduit 273 and central conduit 231, both having inner diameters of 0.5 inches, is about 10 inches.

Inlet and mixing manifold 272 attaches to central mixing block 262 such that the outlet of gas conduit 273 is coupled to mixed deposition gas conduit 293 formed within central mixing block 262. The mating surface surrounding the outlet of gas conduit 273 and the inlet of mixed deposition gas conduit 293 is sealed with an O-ring 213 formed of a chemical resistant elastomer, perfluoroelastomer, or rubber designed for use in fluid seals, such as Kalrez®, Chemraz®, or Viton®. Similarly, the mating surface surrounding the conduit outlet of central conduit 231 and the inlet of central lid bore-through 230 is sealed with an O-ring 222.

To more clearly describe the unique temperature controlled conduits feature of heated feed-through assembly 220 of the present invention, inlet and mixing manifold 272 and central mixing block 262 are described and discussed as separate pieces. One of ordinary skill in the art, however, will appreciate that a single workpiece could be utilized having the described dimensions and characteristics of both inlet and mixing manifold 272 and central mixing block 262 without departing from the scope of the present invention.

The temperatures of each of the conduits formed internal to heated feed-through assembly 220 (265, 276, 278, 273, 293, and 231) are controlled by a plurality of independent units, each having cartridge heaters 264, thermocouples 274, and controllers 277. One unit controls the temperature of conduits 265, 276, and 278 within inlet and mixing manifold 272; another controls the temperature of conduit 273 within inlet and mixing manifold 272; and another controls the temperature of conduits 231, 293 within central mixing block 262. In each block, a plurality of cartridge (or fire-rod type) heaters 264 are advantageously arranged integral to the given block in proximity to the conduit or conduits within a given block. Multiple heaters provide the most efficient heating of the particular conduit or conduits within a given block as the heaters can be located based upon the size, shape, composition, and thermal conductivity of the particular block as well as the particular geometry of the conduits. For the representative system illustrated in FIG. 10, cartridge heaters 264 are about 0.25 inches in diameter, cylindrical in shape, have various lengths, output power capacities, and are available commercially from Watlow Inc. of Richmond, Ill. under the brand name "Firerod."

The set-point temperature is maintained within a given conduit by inputting a desired temperature set-point into the controller 277 for the particular conduit. Controller 277 could be a PID type controller similar to Model 96 that is also commercially available from Watlow, Inc. Thermocouples 274 are embedded within heated feed-through assembly 220 in proximity to each conduit such that the temperature registered by each thermocouple 274 is approximately the same as the temperature within the controlled gas conduit. The position of thermocouple 274 relative to a given gas conduit varies depending upon a number of factors such as the thermal conductivity of the material used to fabricate the given block and the type of thermocouple 274 used. The signal from thermocouple 274 is sent to controller 277, which compares the temperature from thermocouple 274 to the input temperature set-point. Based on the result of this comparison, controller 277 will either increase, decrease, or maintain power supplied to cartridge heaters 264. One advantage of utilizing a plurality of independent thermocouples 274 is that the specific conditions of a given conduit block are taken into account depending upon its geometry, heat losses, and location relative to other sources of heat.

For example, inlet and mixing manifold 272 is in direct contact with heated lid 205. Unless the temperatures between manifold 272 and lid 205 exactly match, manifold 272 will either gain energy from or lose energy to lid 205. The effect of heat transfer between lid 205 and inlet and mixing manifold 272 on the temperature of conduits 265, 276, and 278 within manifold 272 will be reflected in the temperature detected by a thermocouple 274 located within manifold 272. As a result, the controller 277 associated with manifold 272 can increase or decrease the power output of cartridge heaters 264 embedded within manifold 272 in proximity to conduits 265, 276, and 278 to compensate for heat transfer between manifold 272 and lid 205. In the same way, energy transfer between central mixing block 262 and lid 205 is compensated for by the thermocouple, heater, and controller unit associated with block 262. An additional advantage of independently controlling separate areas is that these areas can be heated to different temperatures.

Heat losses from conduit 273 are different from heat transfer in other conduits within manifold 272 and block 262. Gas conduit 273 has a higher potential for heat loss because that part of mixing manifold 272 is not in direct contact with heated lid 205 and has a larger surface area that is exposed to the ambient conditions (about 25 degrees Celsius within the wafer fabrication facility) when cover 203 is removed. When cover 203 is in place, however, as illustrated in FIG. 2, temperatures surrounding heated feed-through assembly 220 increase to about 70 to 80 degrees Celsius. Thus, the heater, thermocouple, and controller unit dedicated to gas conduit 273 are utilized to compensate for the heat transfer characteristics peculiar to that conduit.

More generally, an aspect of the present invention is an apparatus to provide a predetermined temperature within a conduit by the selection, placement, and use of a controller, heater, and thermocouple control unit that utilize the apparatus described above. Another feature of the multiple, independent cartridge heater, thermocouple, and controller units of the present invention is that a uniform conduit temperature throughout heated feed-through assembly 220 can be achieved. Because of their independence, each controller is able to efficiently maintain set-points irrespective of conditions in surrounding blocks, while taking into account: the specific heat losses and conditions surrounding each block, the specific outer shapes of each block, and the geometry of the conduits formed within each block.

In another aspect of the present invention, the temperature set-point of each conduit could be set and maintained to induce a negative temperature gradient where the set-point temperature of central conduit 231 is less than the set-point of conduit 273 and the temperature of conduit 273 is less than that of conduit 278. Alternatively, a positive temperature gradient could be induced where the temperature increases from conduit 278 to conduit 273 to central conduit 231.

In a specific embodiment of the apparatus of chamber assembly 200 of the present invention, mixing manifold 272 is aluminum with the following dimensions: about 7 inches long, about 3.2 inches wide, and about 3.2 inches high. A representative cartridge heater 264 for this block is cylindrically shaped, 0.375 inches in diameter, and 7.0 inches long with a total power output capacity of 500 Watts. In an embodiment of the method and apparatus of the present invention, a single cartridge heater 264 or a plurality of heaters 264 of a selected total power output capacity of about 500 Watts is employed about conduit 273 so that the temperature within mixed deposition gas conduit 273 remains above the vaporization temperature and below the decomposition temperature of the carrier gas/precursor vapor/process gas mixture flowing within conduit 273.

In a specific embodiment where gas conduit 273 is as described above, a thermocouple 274 could be placed between about 0.125 inches to 0.5 inches away from mixed deposition gas conduit 273. In an embodiment of the present invention where the carrier gas/precursor vapor/process gas mixture within conduit 273 comprises a hafnium precursor, a process gas such as oxygen, and a carrier gas such as nitrogen, conduit 273 temperatures between about 130° C. and 160° C. would prevent both condensation and decomposition of the hafnium/oxygen/nitrogen mixture.

A further aspect of the temperature controlled conduits of chamber assembly 200 of the present invention provides temperature controlled delivery of vaporized precursor from vaporizer 520 to central lid bore-through 230. Vaporized precursor exits vaporizer 520 via vaporizer outlet 540 and enters vaporizer outlet manifold 542 that is coupled to vapor inlet 544 of chamber by-pass valve 545. When by-pass valve 545 is positioned to direct flow to processing region 202, precursor vapor exits by-pass valve 545 via chamber outlet 550 flowing then to heated feed-through line 560 that is coupled to heated precursor feed-through 225. In an embodiment of the invention heated feed-through line 560 and heated precursor feed-through 225 are one part. A jacket type temperature controller controls the temperature in conduit 290 between the inlet 544 of three-way valve 545 and the inlet to heated precursor feed-through 225, encompassing line 560 and by-pass valve 545. The jacket type temperature controller comprises a jacket or wrap style heater 275, a controller 277, and a thermocouple 274 and is utilized to maintain a temperature set-point in line 560 and valve 545. The temperature in manifold 542 is controlled by a separate jacket type temperature controller. From a temperature-controlled precursor feed-through conduit 225, precursor vapor flows through precursor lid bore-through 226 into precursor inlet conduit 265 of inlet and mixing manifold 272. An airtight seal is maintained between precursor feed-through conduit 225 and precursor lid bore-through 226, and between process gas chamber feed-through 227 and process gas bore-through 228 using O-rings and a correct fit of chamber lid 205 to chamber body 210. From precursor inlet 265, the precursor vapor flows into mixing conduit 278 where it mixes with process and carrier gases supplied via process inlet conduit 276.

The temperature of precursor vapor within precursor feed-through conduit 225 is maintained by a temperature controlled chamber feed-through 219, which includes a plurality of cartridge heaters 264, a thermocouple 274, and a controller 277. Another feature of temperature controlled chamber feed-through 219 is thermal choke or air gap 212. Air gap 212 is annular about precursor feed-through conduit 225, cartridge heaters 264, and thermocouple 274 and insulates the components of temperature-controlled chamber feed-through 219 from the thermal influences of chamber body 210. Thus, by utilizing the plurality of heaters, controllers and thermocouples described above and the features of heated lid 205, chamber assembly 200, and vapor delivery system 500, the invention provides a temperature controlled flow path for vaporized low vapor pressure precursors from vaporizer 520 to processing region 202.

Process gas heater 582 provides temperature control for process gas and carrier gases for use in chamber assembly 200. Process gas heater 582 is located proximally to chamber body 210 and, more specifically, to process gas chamber feed-through 227 such that the gas temperature exiting gas heater 582 is approximately the same as the gas temperature entering process gas chamber feed-through 227. From process gas chamber feed-through 227, temperature controlled process and carrier gases pass through process gas lid bore-through 228 and enter process gas inlet 276 of inlet and mixing manifold 272.

Another aspect of the present invention is the use of process gas heater 582 to heat process gas and carrier gases above the temperature of the vaporized precursor gas stream. This virtually eliminates the risk that the vaporized precursor will condense when the heated process gas stream and the vaporized precursor gas stream intersect and mix within mixing conduit 278. For example, the temperature set-point of process gas heater 582 could be about 5-10° C. above the temperature set-point of vaporizer 520. Alternatively, a set-point could be utilized that results in process gas temperatures at least as high as the merging precursor vapor stream. In much the same way, to prevent precursor decomposition, the temperature of process gas and carrier gas can be controlled to remain below a set-point where decomposition would occur upon mixing with the precursor vapor stream.

Another aspect of the independent temperature controlled conduits of chamber assembly 200 is that temperature changes within a specific conduit associated with the volume expansion can be compensated for by the independent heater, controller and thermocouple of that particular conduit. For example, heated feed-through line 560 and vaporizer outlet manifold 542 are heated by separate thermocouples, controllers, and jacket style heaters (not shown) so that temperatures within heated feed-through line 560 and vaporizer outlet manifold 542 can be individually maintained above the condensation temperature and below the decomposition temperature of the vaporized precursor, or between about 100° C. and 190° C.

The independently temperature-controlled conduits feature of the present invention provides for a more precise temperature control than previously available and this allows for delivery of vaporized liquid under a variety of thermal conditions that exist as a result of the different environments to which each conduit is exposed. Utilizing the independent thermocouple, controller, heater units that are part of processing system 200 and vapor delivery system 500, a series of temperature controlled conduits is provided that can deliver vaporized low vapor pressure precursors from the outlet of vaporizer 520 to processing region 202. For example, each temperature controlled conduit could be set to maintain a set-point 2-3° C. hotter than the previous conduit so that a slightly positive thermal gradient is maintained between the vaporizer 520 and outlet of central conduit 231 into processing region 202 or, more generally, an overall change in temperature could be maintained between the vaporizer outlet temperature and the temperature in central conduit 231, or a change in temperature of about 20-25° C.

Although the heater type is specified in describing conduit temperature control (such as with cartridge heater temperature controlled conduit 293 and jacket heater temperature controlled conduit 279) these descriptions are not intended to be limiting. One of ordinary skill in the art will appreciate that a variety of heater types, thermocouples, and controllers can be utilized without departing from the scope of the present invention.

There is another aspect to the thermally controlled conduits of processing chamber assembly 200 and vapor delivery system 500 of the present invention. The conduits used downstream of vaporizer 520 in the precursor flow path, as shown in FIG. 10 between vaporizer 520 and central lid bore-through 230, have progressively larger diameters that result in increasing cross-sectional flow areas resulting in an expanded gas flow volume within these conduits. The volume expansion and corresponding pressure drop within the precursor delivery conduits further help maintain conduit conditions that neither condense nor decompose the vaporized precursor. These conditions are above the vapor condensation temperature, yet below its decomposition temperature for the pressure within the vapor supply conduits. For example, representative inner diameters for the chamber illustrated in FIG. 10, are a vaporizer outlet manifold 542 with an inner diameter of 0.18 inches, a heated feed-through line 560, chamber feed-through 225, and inlet 265 with inner diameters of 0.40 inches and a mixed deposition gas conduit 278 and central conduit 231 with inner diameters of about 0.5 inches. For another example, the cross-sectional area of conduit 273 downstream of the intersection of the precursor gas flow and the process gas flow is larger than the sum of the merging gas flows.

The increased volume and correspondingly decreased pressure achieved by advantageously selecting the diameter of manifolds, conduits, and lines, such as 542, 560, 225, 226, 265, 278, 273, 293, and 231 (all downstream from vaporizer 520) in conjunction with the temperature control provided by the thermocouple, heater, and controller sets described above provide a controlled temperature and pressure regime between vaporizer 520 and processing region 202 such that very low vapor pressure precursors, dopants, or other processing materials, may be delivered to processing area 202 without undesired condensation or decomposition.

Figure 11:
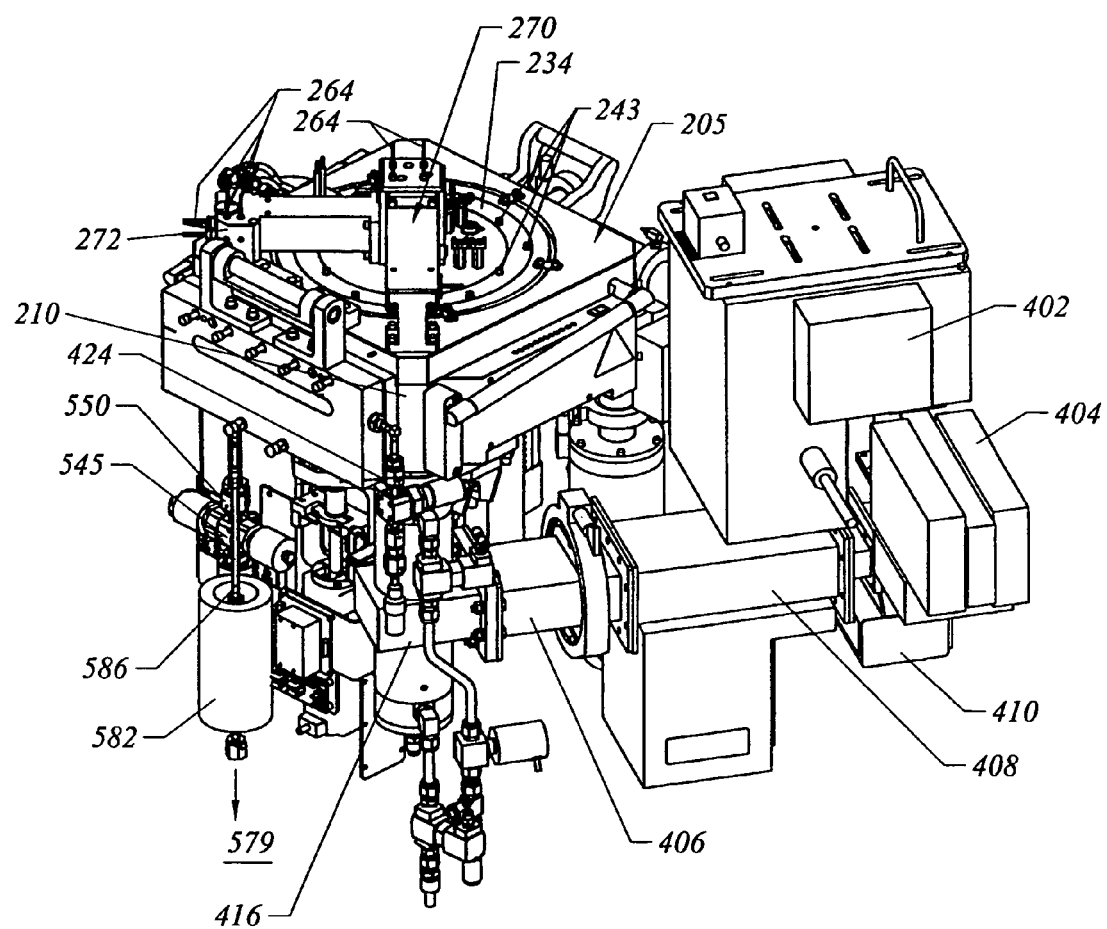
FIG. 11 is a perspective view of an embodiment of the remote plasma generator of the present invention

Referring now to FIG. 11, which is a perspective view of an embodiment of the remote plasma generator of the present invention, another aspect of the processing system 100 of the present invention is a remote plasma generator 400, chamber assembly 200, and components of heated exhaust system 300. Remote plasma generator 400 creates a plasma outside of or remote to processing region 202 for cleaning, deposition, annealing, or other processes within processing region 202. One advantage of remote plasma generator 400 is that the generated plasma or activated species created by remote plasma generator 400 may be used for cleaning or process applications within the processing region without subjecting internal chamber components such as pedestal heater 250 or showerhead 240 to the plasma attack that usually results when conventional RF energy is applied within process region 202 to create a plasma. Several components of remote plasma generator 400 are visible, such as magnetron 402, auto tuner controller 410, isolator 404, auto tuner 408, applicator cavity 416, and applicator heat insulation disc 424.

Magnetron assembly 402 houses a magnetron tube, which produces microwave energy. The magnetron tube comprises a hot filament cylindrical cathode surrounded by an anode with a vane array. This anode/cathode assembly produces a strong magnetic field when it is supplied with DC power from a power supply. Electrons in this magnetic field follow a circular path as they travel between the anode and the cathode. This circular motion induces voltage resonance, or microwaves, between the anode vanes. An antenna channels the microwaves from magnetron 402 to isolator 404 and wave guide 406. Isolator 404 absorbs and dissipates reflected power to prevent damage to magnetron 402. Wave guide 406 channels microwaves from isolator 404 into auto tuner 408. Auto tuner 408 compensates for differences between the impedance of magnetron 402 and the impedance of microwave applicator cavity 416 to achieve the minimum degree of reflected power by adjusting the vertical position of three tuning stubs located inside auto tuner 408. Auto tuner 408 also supplies a feedback signal to the magnetron power supply to continuously adjust the actual forward power to the set-point. Auto tuner controller 410 controls the position of the tuning stubs within auto tuner 408 to minimize reflected power. Auto tuner controller 410 also displays the position of the stubs as well as forward and reflected power readings.

Microwave applicator cavity 416 ionizes a gas or gases supplied via gas supply inlet 412. Gas supplied via gas supply inlet 412 enters a water cooled quartz or sapphire tube within microwave applicator cavity 416, is subjected to microwaves and ionizes. This produces activated species that can be used in cleaning and processing operations within processing region 202. One such cleaning gas is $NF_3$ that can be used to supply activated fluorine for cleaning processing region 202. Activated species can also be used to anneal or otherwise process semiconductor or other materials present on a substrate 201 positioned within processing region 202. An optical plasma sensor 414 detects the existence of plasma within cavity 416. Activated species generated within cavity 416 are supplied to activated species chamber feed-through 229 via adapter tube 418. Adapter tube 418 is insulated from the elevated temperature of chamber body 210 by adapter tube heat insulation disc 424. In an embodiment of the invention, adapter tube 418 is eliminated and activated species are supplied directly to activated species chamber feed through from cavity 416.

From activated species chamber feed-through 229, the activated species pass through lid bore-through 221 and enter heated plasma manifold 270 that provides an O-ring sealed, air tight conduit (activated species conduit 271) between lid bore-through 221, and central gas feed-through 231 within central mixing block 262. In an embodiment of the invention, the remote plasma generator uses RF energy, rather than microwave.

Figure 12:
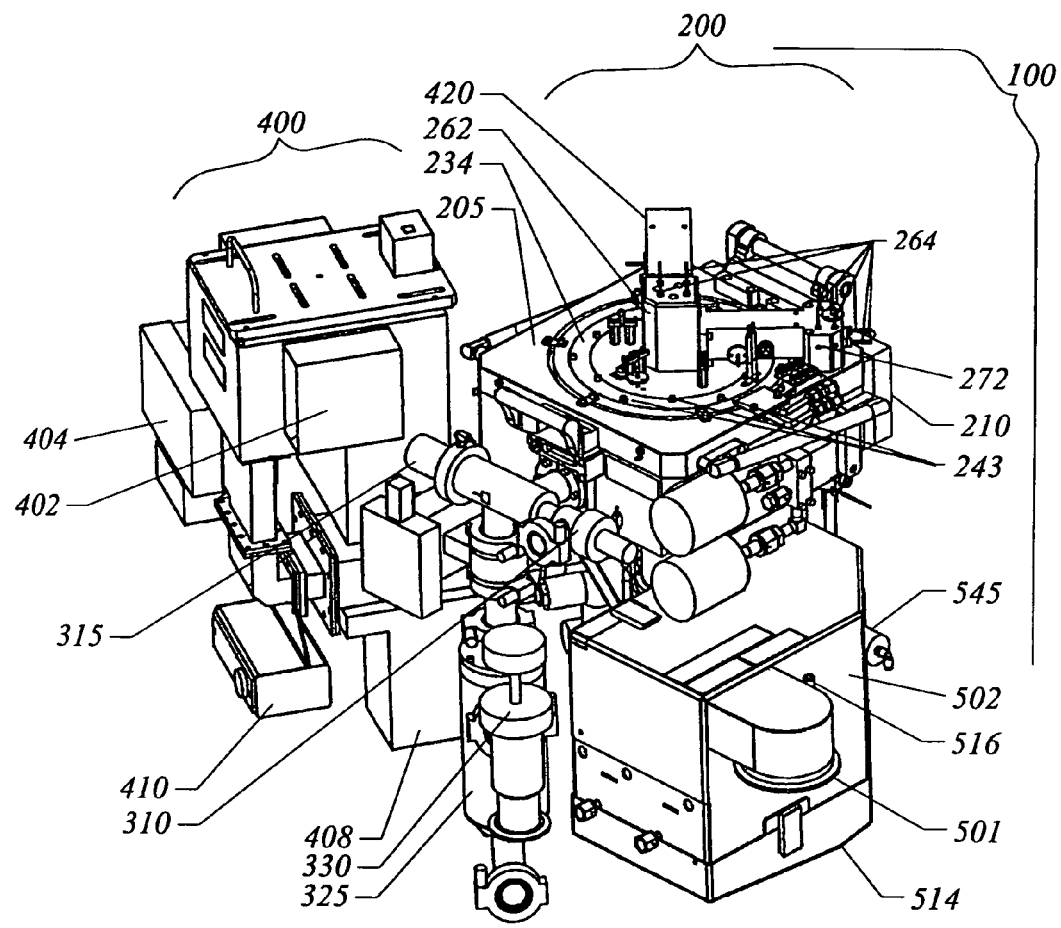
FIG. 12 is a perspective view of an embodiment of the exhaust system of the present invention.
Figure 13:
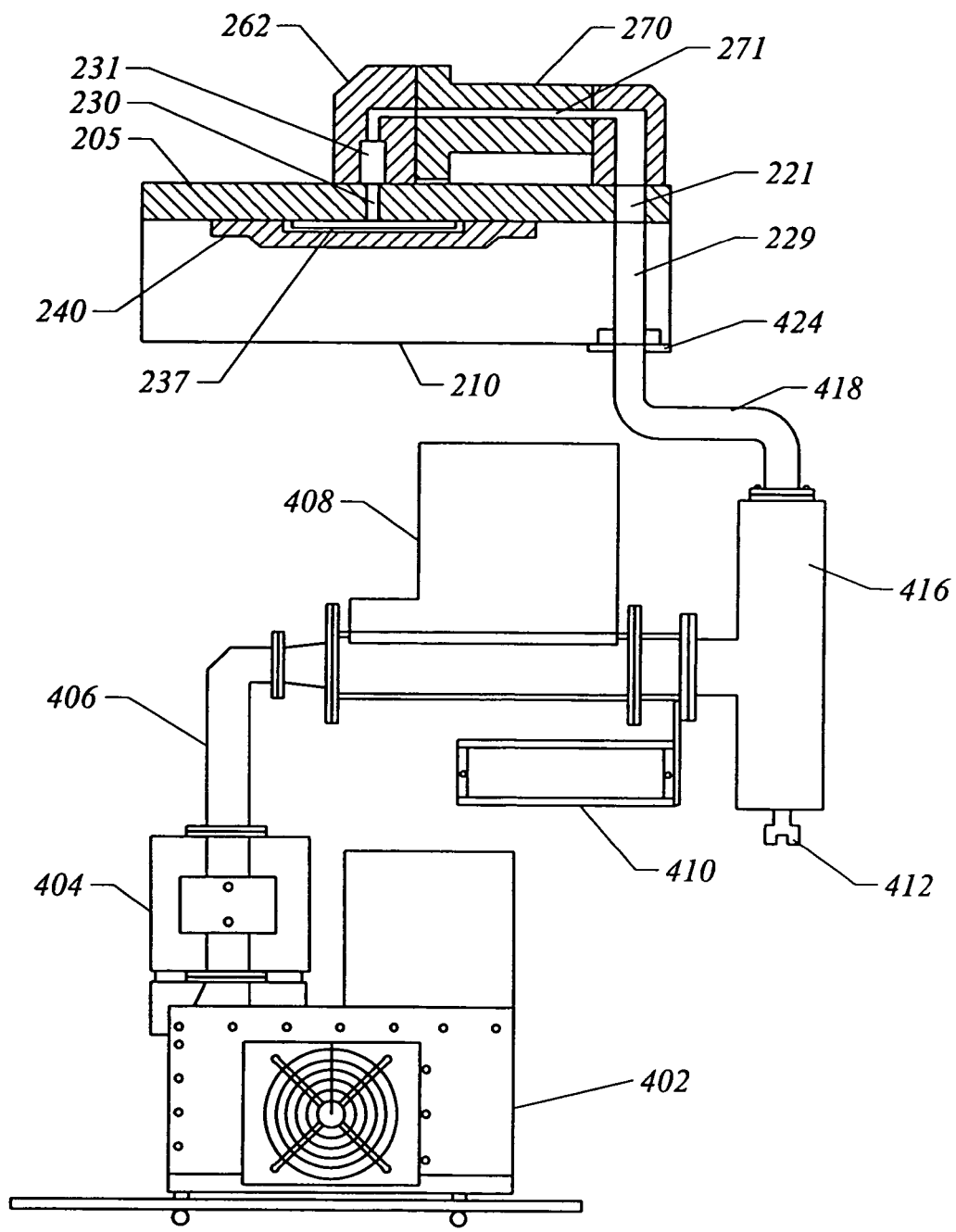
FIG. 13 is a schematic view of a remote plasma generator of the present invention.

Referring FIG. 12, which is a perspective view of an embodiment of the exhaust system of the present invention, the components and features of heated exhaust system 300 of processing system 100 can be better appreciated. The components of heated exhaust system 300 are collectively referred to as a foreline. The foreline is in communication with a vacuum pump (not shown) and wafer fabrication facility exhaust systems (not shown) to provide for reduced pressure processing operations within processing region 202. Exhaust from processing and cleaning operations conducted within processing region 202 is exhausted via chamber exhaust port 305. In this embodiment of the invention, exhaust port 305 (FIG. 2) is eliminated and the exhaust processing region 202 is exhausted directly into isolation valve 310. When closed, isolation valve 310 shuts off chamber assembly 200 from down stream vacuum pump systems. During normal operation, isolation valve 310 is open and throttle valve 315 opens and closes to regulate pressure within processing region 202. By-pass inlet 320 (FIG. 2) receives precursor vapor/carrier gas mixture from chamber by-pass valve outlet 555 (FIG. 10) when chamber by-pass valve 545 (FIG. 2) is positioned to flow precursor vapor/carrier gas mixture to temperature controlled by-pass line 322 (FIG. 2). Exhaust system components (chamber exhaust port 305, isolation valve 310, throttle valve 315, by-pass inlet 320, and by-pass line 322) are temperature controlled to prevent unreacted precursor condensation. Cold trap 325 and the remaining downstream exhaust system components are maintained at or below room temperature. In an embodiment of the invention, the temperatures of the cold trap 325 and the remaining downstream exhaust system components are not maintained at a specific temperature.

As a result, any unreacted vapor remaining in the exhaust stream from processing region 202, or vapor from chamber by-pass valve 545 will remain gaseous in the temperature controlled or heated portion of exhaust system 300 and then condense within cold trap 325 thus preventing damage to the vacuum pumps or accumulation and resulting line blockages within exhaust system piping. Additionally, collection of unreacted vapor within cold trap 325 also minimizes the exposure of maintenance personnel to potentially hazardous chemicals. Cold trap 325 is equipped with an isolation valve 330 for separating cold trap 325 from vacuum pumping systems to allow for routine maintenance or cleaning.

Figure 16:
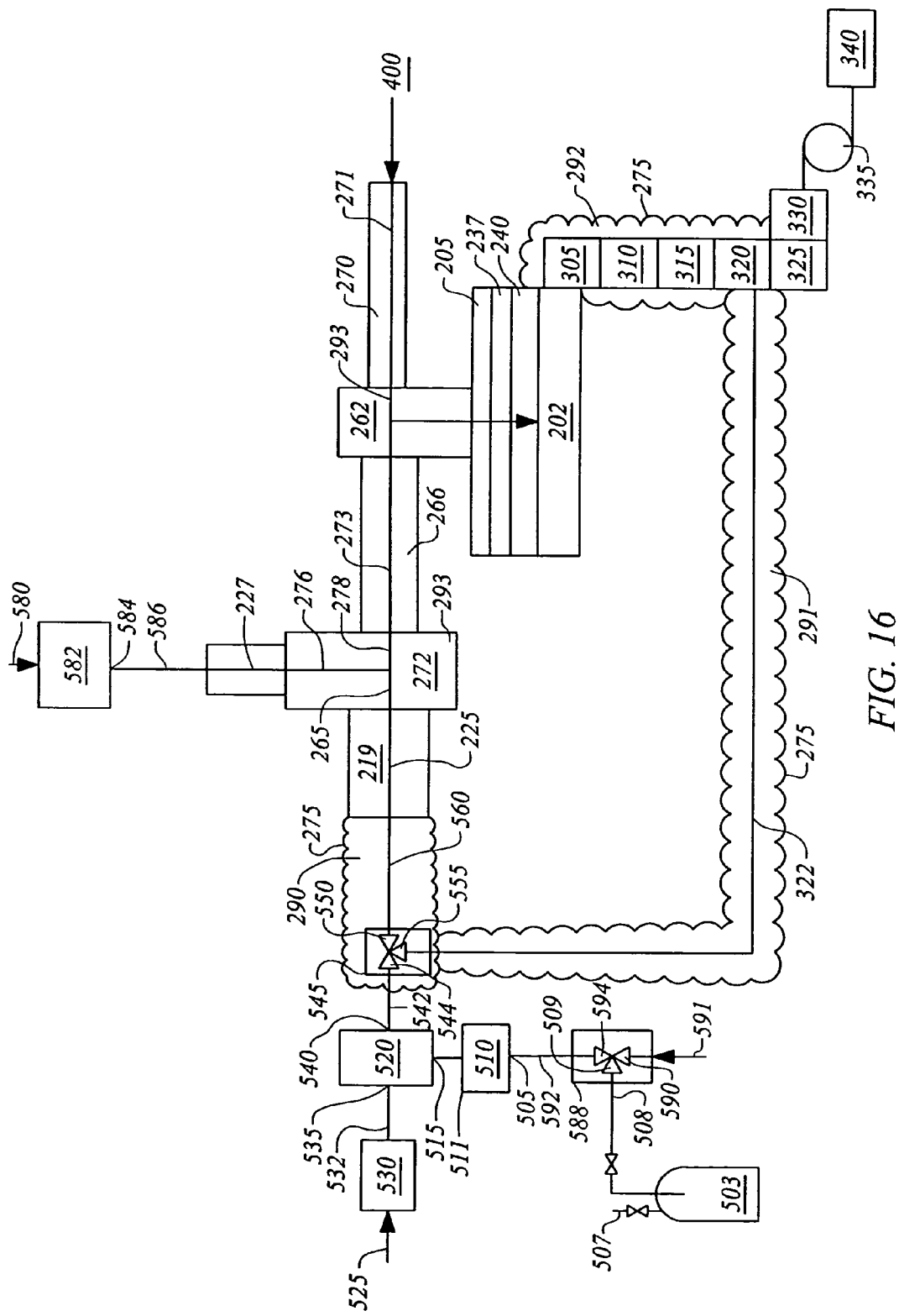
FIG. 16 is a schematic drawing of a representative liquid delivery system (LDS) and vapor delivery system with one vaporizer.

To provide a clear illustration of the relationships between the various components of exhaust system 300 and the other components of processing system 100, the independent thermocouple, controller, and heater utilized as part of the temperature controlled feature of exhaust system 300 is not shown in FIG. 12. Turning briefly to FIG. 16, which is a schematic drawing of a representative liquid delivery system (LDS) and vapor delivery system with one vaporizer, the temperature controlled conduits of exhaust system 300 appear more clearly. A jacket style heater 275, thermocouple (not shown), and controller (not shown) are utilized to measure and maintain a set-point temperature in chamber exhaust port 305, isolation valve 310, throttle valve 315, and chamber bypass inlet 320, thereby combining to create a jacket heater controlled conduit 292 in the exhaust components upstream of cold trap 325. Chamber by-pass line 322 is included in another jacket style heater temperature controlled conduit 291 between chamber by-pass valve 545 and exhaust by-pass inlet 320 using a separate thermocouple, controller, and heater 275.

Figure 14:
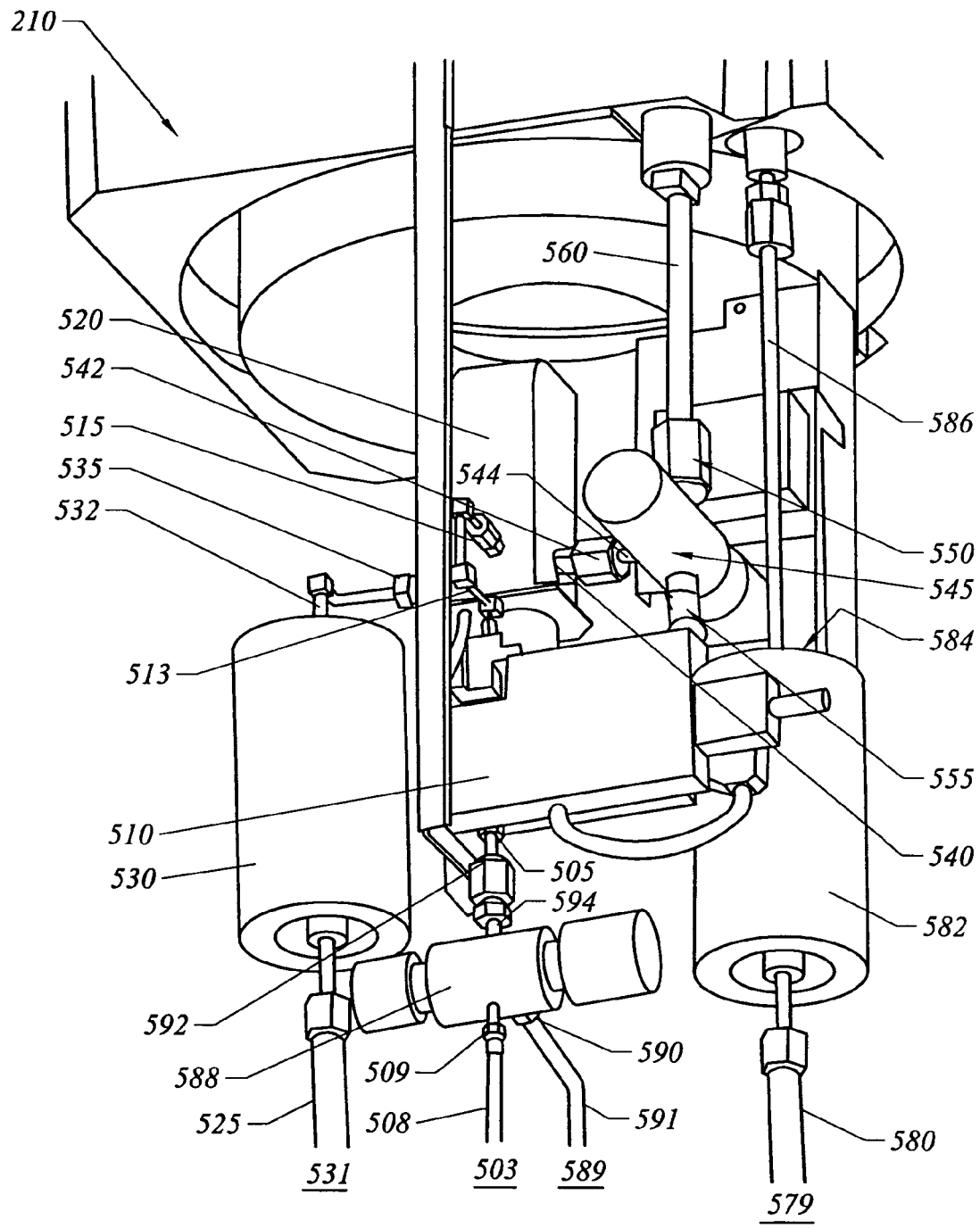
FIG. 14 is a perspective view of an embodiment of the vapor delivery system of the present invention.

Turning now to FIG. 14, which is a perspective view of an embodiment of the vapor delivery system of the present invention, the compact design feature of vapor delivery system 500 of the present invention can be better appreciated. Vapor delivery system 500 provides a method and an apparatus for supplying controlled, repeatable, vaporization of low vapor pressure precursors for film deposition on a substrate 201 located within processing region 202. One method provides for the direct injection of vaporized High k precursors. One of ordinary skill will appreciate the specific features detailed below that allow vapor delivery system 500 to vaporize and precisely control the delivery of liquid precursors including those precursors having vapor pressures significantly lower than precursors utilized in prior art vapor delivery systems or, specifically, precursors having vapor pressures below about 10 Torr at 100° C. (FIG. 1).

The various components of vapor delivery system 500 are placed in close proximity to chamber assembly 200 in order to minimize the length of temperature controlled vapor passageways between the outlet of vaporizer 520 and processing region 202. Even though practice in the semiconductor processing arts is to place vapor systems remotely from processing chambers to either ensure serviceability or reduce the amount of cleanroom space occupied by a processing system, vapor delivery system 500 of the present invention utilizes an innovative compact design that allows all system components—except for the bulk liquid precursor, carrier gas, and process gas supplies—to be located directly adjacent to chamber assembly 200 and in close proximity to precursor and process gas chamber feed-throughs 225 and 227.

Figure 17:
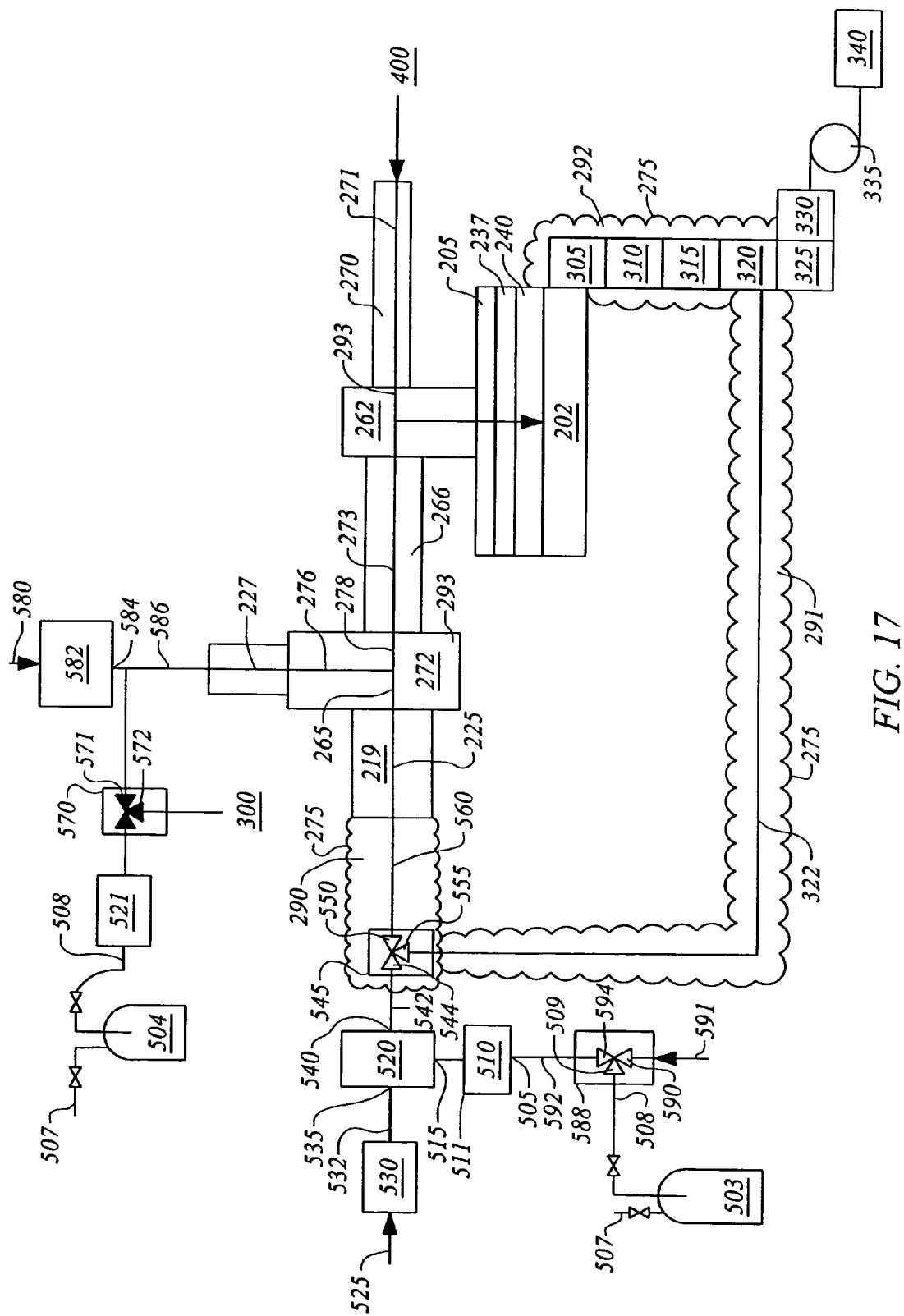
FIG. 17 is a schematic drawing of a representative LDS and vapor delivery system with two vaporizers.

A low vapor pressure liquid precursor can be stored in a bulk storage container (ampoule) 503 located remotely or on mainframe support 105 in LDS housing 108 (FIG. 3) in closer proximity to processing chamber assembly 200. Locating bulk storage containers and solvent containers in on-board LDS housing 108 on mainframe 105 reduces the liquid line length between containers and vaporizers allowing more precise control and repeatability of liquid delivery. Liquid precursor stored in container 503 is maintained under pressure of an inert gas such as Helium at about 15 to 60 psig supplied by supply line 507 (FIGS. 16 and 17). The gas pressure within container 503 provides sufficient pressure on the liquid precursor such that liquid precursor flows to other vapor delivery system components, thus removing the need for a pump to deliver the liquid precursor. The outlet of container 503 is provided with a shut-off valve (not shown) to isolate bulk storage container 503 for maintenance or replenishment of the liquid precursor. As a result of the pressure head on container 503, liquid precursor from container 503 is provided to a precursor supply line 508 and the precursor inlet 509 of three-way inlet valve 588. When valve 588 is set to pass through liquid precursor, three-way inlet valve 588 provides liquid precursor to precursor/solvent outlet 594 and into precursor/solvent supply line 592 to liquid flow meter inlet 505. Liquid flow meter 510 measures precursor flow rate and provides liquid precursor via liquid flow meter outlet 511 (FIGS. 15, 16, and 17) to vaporizer supply line 513 and then to vaporizer inlet 515. Vaporizer 520 in conjunction with a heated carrier gas (described below) converts the liquid precursor into precursor vapor.

Carrier gas supply line 525 supplies a carrier gas, such as nitrogen or helium, to carrier gas heat exchanger 530 at a pressure of about 50 Torr. Carrier gas heat exchanger 530 preheats the carrier gas to a temperature such that the heated carrier gas stream entering vaporizer 520 does not interfere with the efficient vaporization of the precursor liquid undergoing vaporization within vaporizer 520. Carrier gas heat exchanger 530 heats the gas using a resistive heater like the carrier gas heat exchanger Model HX-01 commercially available from Lintec. Heated carrier gas is provided to vaporizer 520 via carrier gas supply line 532 and carrier gas inlet 535. The heated carrier gas should not be overheated because a carrier gas heated above the decomposition temperature of the precursor undergoing vaporization could result in precursor decomposition within vaporizer 520. Thus, carrier gas heat exchanger 530 heats the carrier gas into a temperature range bounded by the condensation temperature of the precursor at the lower limit and the decomposition temperature of the precursor at the upper limit.

For a hafnium precursor a representative vaporization temperature is about 130° C. and a decomposition temperature is about 190° C. A typical carrier gas such as nitrogen is provided to a vaporizer 520 that is vaporizing a hafnium precursor at about between 200 and 2000 standard cubic centimeters per minute (sccm) and a temperature of between about 110° C. and about 160° C. These conditions result in a vaporized precursor flow rate in the range of about 10-50 milligrams per minute. In an embodiment of the invention the vaporization temperature can be set up to 180° C.

Carrier gas temperature should also be such that the temperature of the carrier gas entering vaporizer 520 is at least as high if not higher than the vaporization temperature of the precursor being vaporized in vaporizer 520. Of particular concern is the prevention of precursor vapor condensation within the small diameter conduits that exist within vaporizer 520. Carrier gas temperatures below vaporization conditions within vaporizer 520 could cool the vaporized precursor enough that condensation results and should therefore be avoided.

Figure 15:
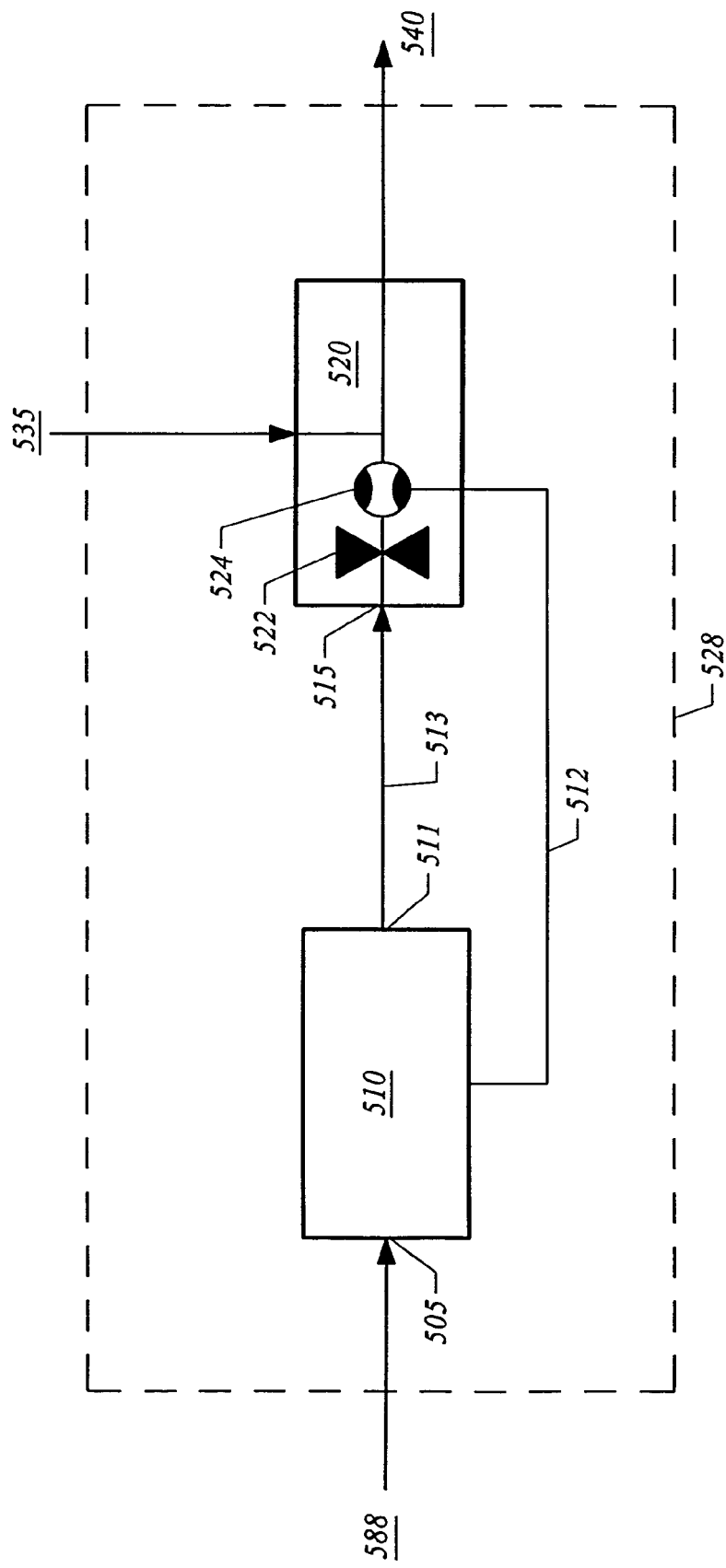
FIG. 15 is a schematic drawing of a representative liquid flow controller of the present invention.

Referring now to FIG. 15, which is a schematic drawing of a representative liquid flow controller of the present invention, liquid flow controller 528 includes a liquid flow meter 510 and a vaporizer 520. Liquid precursor enters liquid flow meter 510, which generates a measured flow rate signal 512. The precursor flows from liquid flow meter outlet 511 into vaporizer supply line 513 and then into vaporizer inlet 515. Located within vaporizer 520 between vaporizer inlet 515 and metering valve 524, is a positive shut-off valve 522 that provides the capability to cut-off liquid flow before the vaporization point within vaporizer 520. Vaporizer 520 reads signal 512 and adjusts metering valve 524 to achieve a target flow. Positive shut off valve 522 is a pneumatic valve that is controlled by on-board software control module 1000 (FIG. 21). Although metering valve 524 can provide a shut-off capability when in a "closed" or zero set-point condition, positive shut-off valve 522 provides added assurance that no liquid will continue to flow through vaporizer 520 when liquid flow controller 528 is in a "closed" or zero set-point condition. The location of positive shut-off valve 522 relative to metering valve 524 is such that there is a minimal volume of liquid that could remain in the line between shut-off valve 522 and metering valve 524.

A typical flow rate signal 512 is measured in milligrams per minute or mg/min. A representative flow rate for a High k precursor is 7 mg/min for a representative $HfO_2$ film produced utilizing the method and apparatus of the present invention.

A representative vaporizer 520 suitable for vaporization of low vapor pressure liquids could position positive shut-off valve 522 about one inch or less from metering valve 524. For example, using a 0.125 inch outer diameter line between shut-off valve 522 and metering valve 524 creates a liquid precursor volume of about 0.012 cubic inches. Reducing the volume between these components minimizes the amount of precursor that could vaporize after positive shut-off valve 522 is closed. Positive shut-off valve 522 could also be a type of valve known as a "zero dead volume" valve.

Another aspect of liquid flow controller 528 is that the length of vaporizer supply line 513, which is typically 0.069 inch inner diameter stainless steel piping is minimized to attain controllable low vapor pressure precursor output from vaporizer 520. Minimizing the length of supply line 513 allows more effective liquid metering and control by minimizing the distance between the liquid flow meter outlet 511 and vaporizer inlet 515. Spacing between vaporizer inlet 515 and liquid flow meter outlet 511 of about 3.4 inches or between about 2 inches and 15 inches leads to more effective metering and controlled vaporization of low vapor pressure precursors, for example liquid precursors having a vapor pressure below about 10 Torr at 100° C.

In an embodiment of the invention, liquid flow meter 510 contains the metering valve 524 and vaporizer 520 does not. In this embodiment liquid flow meter 510 measures the flow and also adjusts the flow using the self-contained metering valve 524. As a result, there is no flow rate signal 512 between vaporizer 520 and liquid flow meter 510, vaporizer 520 vaporizes the flow, but vaporizer 520 does not perform a metering function.

Minimizing the distance between liquid flow meter 510 and vaporizer 520, however, adds to the number of vapor delivery system components placed in proximity to chamber assembly 200 and increases the density of equipment mounted on chamber assembly 200. But vapor delivery system 500, along with the remote plasma generator 400, and heated exhaust system 300, have been designed to minimize interference between the subsystems of processing system 100 while achieving the compact design desired in cluster tool wafer processing systems.

Returning to FIG. 14, vaporized precursor flows from vaporizer outlet 540, into vaporizer outlet manifold 542, then into vapor inlet 544 of temperature controlled by-pass valve 545. When valve 545 is set to pass vaporized precursor to the chamber, by-pass valve 545 supplies vapor to chamber outlet 550 and then into temperature controlled heated feed-through line 560. The thermocouples, controllers, and jacket style heaters that maintain a temperature set-point within vaporizer outlet manifold 542, chamber by-pass valve 545, and heated feed-through line 560 are a feature of the vapor delivery system 500, but are omitted for clarity. The internal piping of chamber by-pass valve 545 allows the vaporized precursor/heated carrier gas mixture to be sent to processing region 202 via chamber outlet 550.

Additionally or alternatively, while stabilizing vapor flow or conducting cleaning operations within processing region 202, chamber by-pass valve 545 could direct the vaporized precursor/heated carrier gas mixture to heated by-pass line 322 (FIG. 2) of heated exhaust system 300 (described above) via outlet 555. One advantage of chamber by-pass valve 545 of the present invention is that once liquid flow controller 528 attains a desired set-point vapor flow rate the vaporized precursor/heated carrier gas mixture can either be directed to the chamber for deposition or to the foreline by-pass inlet 320 for disposal. Thus, independently from any operations within processing region 202, liquid flow controller 528 continues to produce a stable, consistent vapor flow rate. And chamber by-pass valve 545 used in conjunction with liquid flow controller 528 provides repeatable, stable vapor flow rates to consecutive substrates 201 within processing region 202. Such repeatable, stable vapor flow rates are desired for the deposition of transition metal dielectric materials such as tantalum oxide for used in ICs in devices such as stacked capacitors and hafnium oxide for use in ICs in devices such as High k transistors.

Vaporizer outlet manifold 542 and heated feed-through line 560 are standard piping that could be made of stainless steel. Heated feed-through line 560 should be as short as possible to minimize the length of travel of vaporized precursor within the system to between about 4 to 6 inches. Heated feed-through line 560 is in communication with chamber outlet 550 and precursor chamber heated feed-through 225.

To prevent condensation of the vaporized precursor within the vaporized precursor/heated carrier gas mixture, heated feed-through line 560 and vaporizer outlet manifold 542, like all precursor supply conduits downstream of vaporizer 520, have an inner diameter that is greater than the inner diameter of the liquid supply line into vaporizer 520. As discussed previously regarding FIG. 15, the vaporizer liquid supply line is typically made of stainless steel with about a 0.069 inch inner diameter while the conduits downstream of vaporizer 520 could have a larger diameter, such as an outer diameter of about 0.5 inches, or an inside diameter of about 0.4 inches.

Vapor delivery system 500 also has a temperature controlled process gas feature. Process gas heater 582, which is similar to carrier gas heat exchanger 530 described above, receives process gas via supply line 580 from a process gas supply. Suitable process gases depend on the desired film deposition. Typically, oxygen ($O_2$) and nitrous oxide ($N_2O$) are suitable for oxidation processes and ammonia ($NH_3$) is suitable for nitride processes. Additionally, nitrogen ($N_2$) could be added to the process gas flow as a carrier gas. The term process gas stream used below refers to all gas flows out of gas heater 582 and is intended to include process gas, carrier gases, or other gases described above.

Process gases and carrier gases are preheated by process gas heater 582 so that the resulting process gas stream is maintained above the temperature of the adjacent vaporized precursor gas stream. Maintaining the process gas stream temperature about 10°-15° C. above the temperature of the vaporized precursor gas stream assists in the prevention of inadvertent condensation of the precursor vapor when the gas streams intersect and begin to mix within mixing conduit 278. Similarly, gas heater 582 also helps ensure that process gas stream temperatures are maintained below the decomposition temperature of the precursor gas stream so that inadvertent decomposition of the precursor vapor stream does not occur when the gas streams mix within mixing conduit 278.

Thus, a temperature controlled gas stream exits process gas heater 582 via outlet 584 and enters process gas supply line 586. Returning briefly to FIG. 10, from process gas supply line 586 the process gas stream flows through process gas chamber feed-through 227 that in turn flows into heated process gas inlet conduit 276. Process gas inlet conduit 276 flows into and mixes with vaporized precursor flow stream in heated mixing conduit 278.

Referring again to FIG. 14, another feature of vapor delivery system 500 is the ability to provide a solvent flush capability to those conduits that come into contact with the vaporized low vapor pressure precursors. Such solvent operations complement the ability of the method and apparatus of the present invention to vaporize low vapor pressure liquids with the ability to clean the apparatus afterwards. A solvent such as anhydrous isopropyl alcohol, methanol, hexane, ethanol, or other suitable solvent is supplied from a bulk solvent container 589 into precursor/solvent three-way valve 588 via solvent delivery line 591 and inlet 590. From three-way valve 588 the solvent follows the same flow path as a vaporized precursor through the various components of vapor delivery system 500 and, depending upon the alignment of chamber by-pass valve 545, to chamber assembly 200 or exhaust system 300 via by-pass line 322. As the solvent flows through the various conduits that are exposed to liquid precursor, such as the conduits of liquid flow controller 528, the solvent mixes with precursor liquid and purges the line of residual precursor. This allows a subsequent exposure of the components to air for maintenance or component change. Because of the low vapor pressure of typical precursors vaporized using the methods and apparatus of the present invention, without the solvent flush capability residual precursor vapors within conduits would not be sufficiently evacuated nor achieve reduced pressures in a timely—commercially viable—manner simply using only pumping system 355 of exhaust system 300. Additionally, the solvent flush feature can be used to remove precursor vapor from process conduits and components to prevent risk of exposure to potentially hazardous materials during maintenance as well as prevent the undesired reaction of precursor vapor with air, water vapor, or other materials.

FIG. 16 is a schematic drawing of a representative LDS and vapor delivery system with one vaporizer and FIG. 17 is a schematic drawing of a representative LDS and vapor delivery system with two vaporizers. FIGS. 16 and 17 allow a better understanding of an integrated method of operating processing system 100 and the use and interoperability of dopant, second dielectric, or second precursor materials within the various embodiments of the present invention. FIG. 16 schematically represents a system configuration using a single vaporizer and process heat exchanger to provide process gas/precursor vapor mixtures through temperature controlled conduits to processing region 202.

FIG. 17 is similar to FIG. 16 with the addition of a second vaporizer 521, bulk container 504 and by-pass valve 570. Flow through second vaporizer 521 is controlled as discussed regarding vaporizer 520, but for clarity the elements associated with a second liquid flow controller are not shown. Under the representative configuration of FIG. 17, processing system 100 of the present invention is further enabled to not only provide, mix, and deposit films from a single precursor, but also, by modifying the liquid source contained in bulk container 504, films containing a second precursor, a dopant, or a metal.

Processing system 100 as embodied in FIG. 17 operates similarly to previous descriptions of processing system 100 with the addition of an additional bulk container 504, which could be under a pressure head as with bulk supply container 503. Bulk container 504 is coupled to and supplies processing fluids to a second vaporizer 521, which operates similarly to the first vaporizer 520 as embodied in FIG. 16 and described above. The vaporized precursor stream created by the second vaporizer 521 is provided to a chamber by-pass valve 570 that connects, via outlet 571, the vaporized gas stream to chamber assembly 200 via process gas supply line 586. Alternatively, by-pass valve 570 can connect the vaporized precursor stream to exhaust system 300 via outlet 572. Temperature control methods described above are used to provide temperature controlled conduits to provide low vapor pressure precursors to second vaporizer 521 and to convey vapor from vaporizer 521 to processing region 202. In addition, the components associated with second vaporizer 521 are equipped like the components associated with vaporizer 520 to heat the carrier gas and the vaporized precursor/carrier gas mixture.

Another object of the vapor delivery system 500 of the present invention is the deposition of a variety of films on substrates 201 within process area 202 by advantageously selecting precursors for bulk containers 503, 504, process gases or carrier gases for gas source 579, and by selective positioning of by-pass valves 545 and 570. One advantage of the 2 vaporizer-2 by-pass configuration of FIG. 17 is that each vaporizer may be in operation and producing stable, repeatable flow that could be easily ported to process region 202 or exhaust system 300 by aligning the appropriate by-pass valve 545 or 570.

Figure 18:
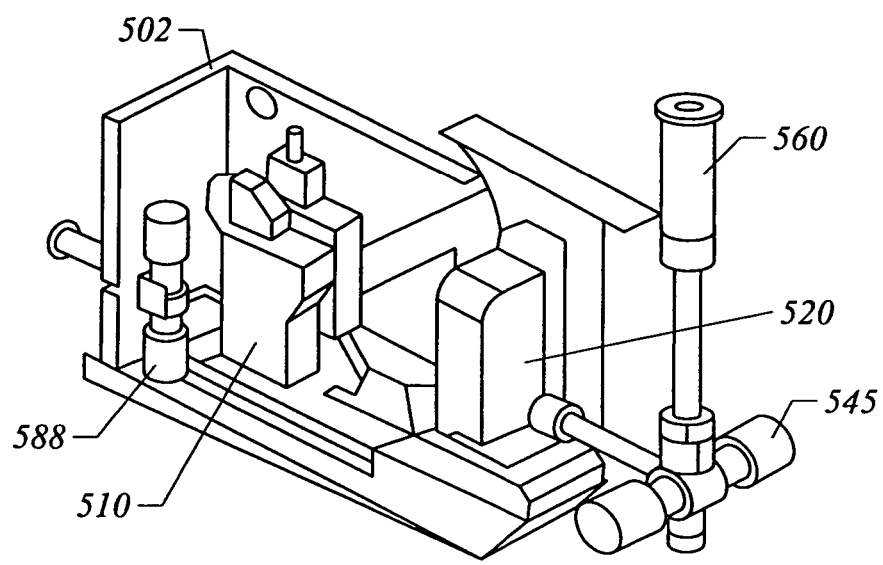
FIG. 18 is an alternative embodiment of the liquid and vapor delivery systems of FIG. 2.

Referring now to FIG. 18, which is an alternative embodiment of aspects of the liquid and vapor delivery systems of FIGS. 2-17, this configuration of the invention employs the same functional relationships between the components as discussed with reference to FIGS. 2-17, but in an alternative layout where liquid flow meter 510 and vaporizer 520 are arranged horizontally relative to each other in a vaporizer box 502.

Figure 19:
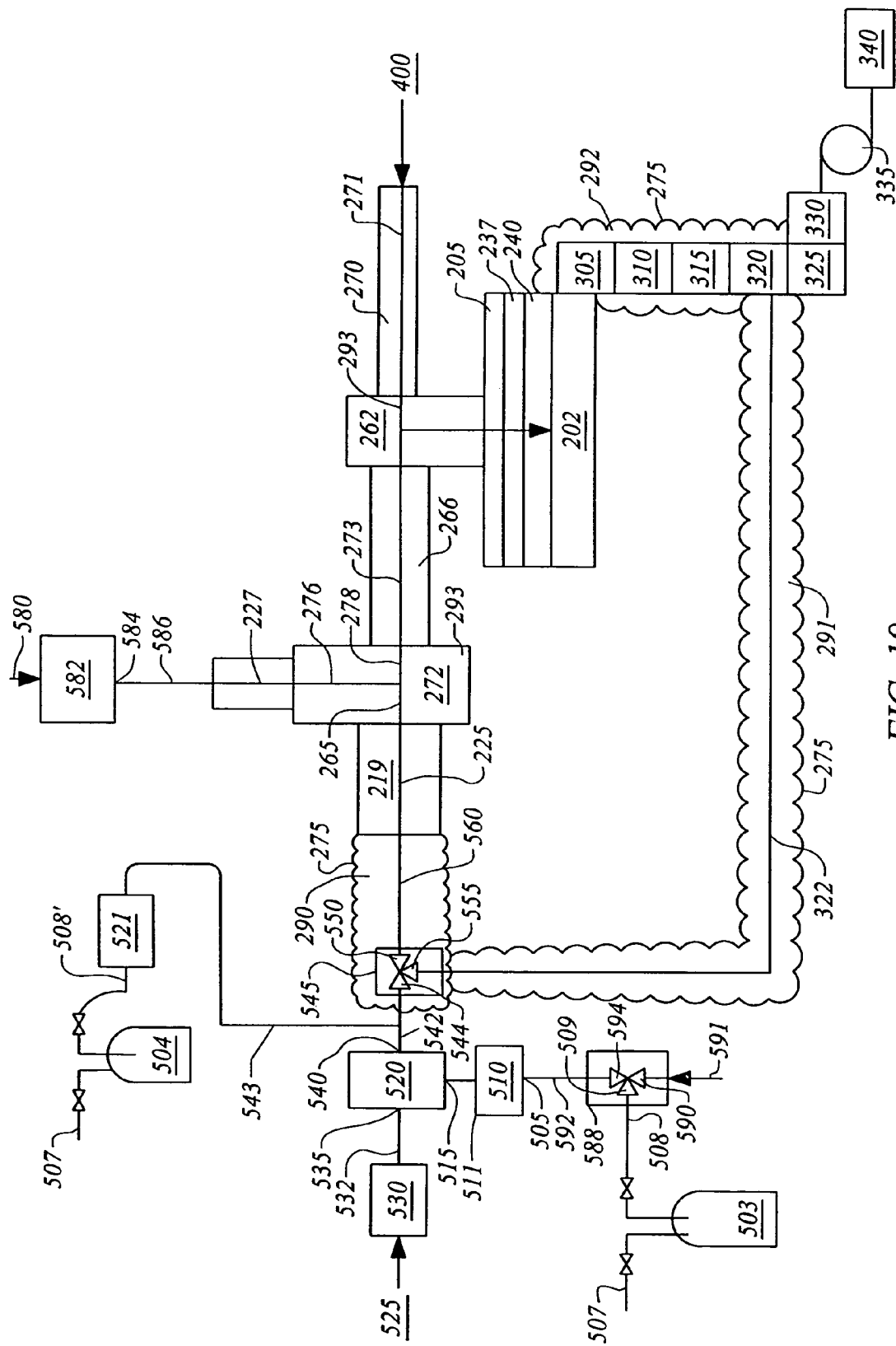
FIG. 19 is a schematic drawing of a second representative LDS and vapor delivery system with two vaporizers.

Now referring to FIG. 19, which is a schematic drawing of a second representative LDS and vapor delivery system with two vaporizers, this embodiment includes a second vaporizer 521 and the corresponding components (not shown) that supply vaporizer 521 with precursor fluid, solvent, and carrier gas as supplied to vaporizer 520, such as a second liquid flow meter 510', a second three-way inlet valve 588', a second carrier gas supply line 532', a second carrier gas heat exchanger 530', and a second positive shut-off valve 522'. In this embodiment the vaporized precursor exits vaporizer 521 and flows through vaporizer outlet conduit 543 directly into vaporizer outlet manifold 542. Thus, vaporized precursor from both vaporizers 520, 521 enters and is directed by by-pass valve 545 to either heated feed-through line 560 or by-pass line 322.

Figure 20:
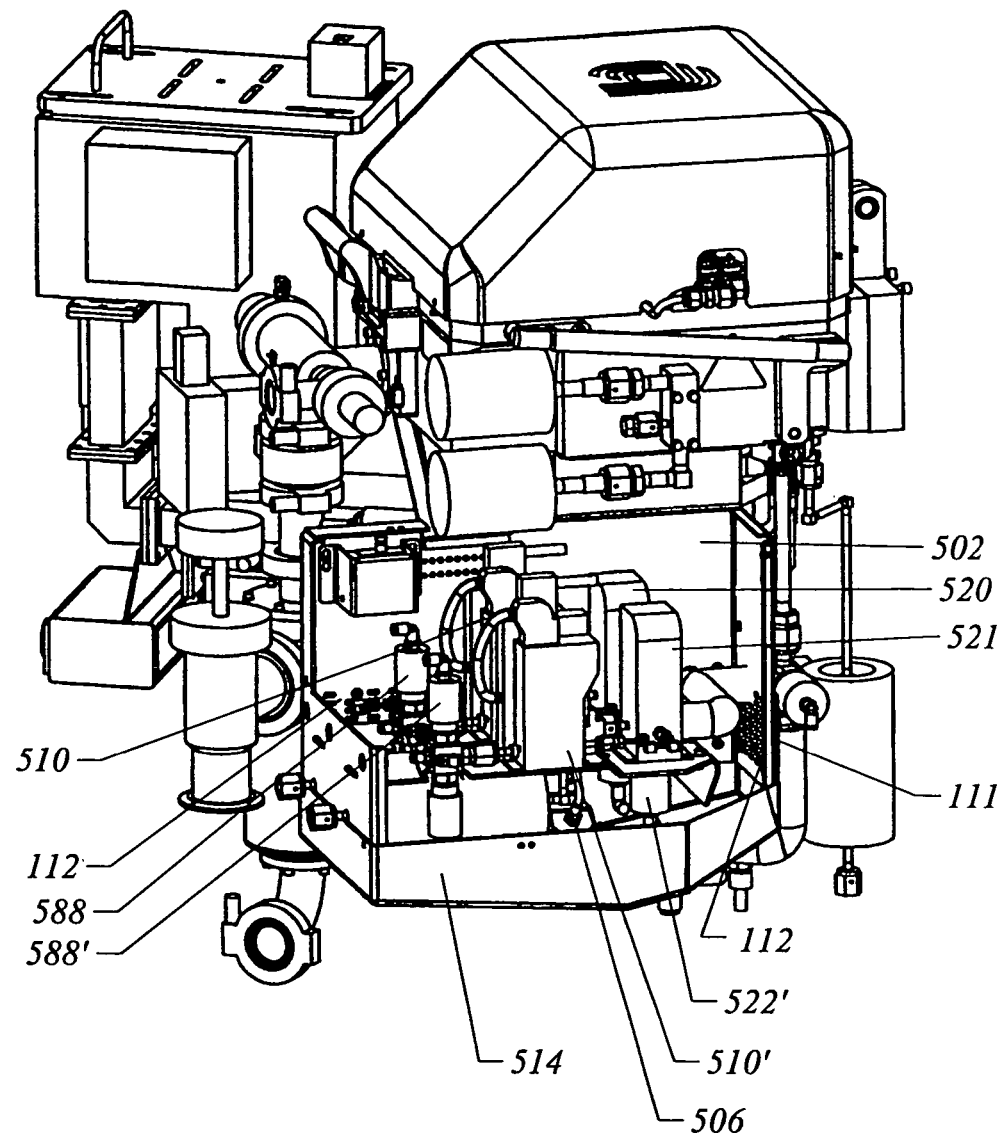
FIG. 20 is an alternative embodiment of the liquid and vapor delivery systems of FIG. 19.

Referring now to FIG. 20, which is an alternative embodiment of the liquid and vapor delivery systems of FIG. 19, this configuration of the invention employs the same functional relationships between the components as discussed with reference to FIG. 19. But in this alternative layout liquid flow meters 510, 510' and vaporizers 520, 521 are arranged horizontally relative to each other in a vaporizer box 502, somewhat akin to the configuration of FIG. 18. Vaporizer box 502 with spill pan 514 encloses the vaporizers in a manner similar to LDS housing 108 of FIG. 4. Vaporizer box 502 has slotted plates 111 that interact with horizontal slots 112 that are shown about the interior base of vaporizer box 502. House exhaust is attached through exhaust port 501 (FIG. 12), drawing air through horizontal slots 112. Slotted plates 111 adjust as discussed with reference to FIG. 4 to tune the vaporizer box exhaust flow, although slotted plates 111 in FIG. 20 are modified to be tuned in a side-to-side fashion. Optical switch 506 detects whether any liquid is present in spill pan 514. Optical switch 506 is an interlocked hardware switch that de-energizes the gas and precursor control valves as listed in Table I. Also, as part of the interlock system, a sensor (not shown) monitors airflow through exhaust port 501 (FIG. 12) via a sensor port 516 (FIG. 12) and the system de-energizes the gas and precursor control valves should the flow be too low, as listed below in Table I. Although it is not shown in FIG. 4, LDS housing 108 may also be fitted with a spill pan and an interlocked optical switch in the manner of vaporizer box 502.

FIG. 21 is a schematic of an embodiment of the present invention with two vaporizers mounted on the chamber lid. In this embodiment dual independent temperature controlled vaporizers 520, 521 are mounted on chamber lid 205 along with many of the components of two vapor delivery systems 500 to create a chamber lid/vaporizer assembly 800. Mounting vaporizer delivery systems 500 on the chamber lid 205 minimizes the heated path of the vaporized precursor materials from the point of vaporization in vaporizers 520, 521 to processing region 202. Similarly numbered elements function as discussed with reference to the earlier embodiments depicted in FIGS. 2-16.

Chamber lid/vaporizer assembly 800 also generally incorporates oxidizer (process) gas heater 582, carrier gas heat exchangers 530, 530', three-way inlet valves 588, 588', liquid flow meters 510, 510', positive shut off valves 522, 522', vapor delivery manifolds 802, 803, union block 826, valve block 828, inlet and mixing block 830, liquid spill detector 804 (FIG. 27), cover interlock switch 806 (FIG. 27), flexible double-contained liquid lines 700, 707, 708, and heated plasma manifold 270.

Carrier gases from carrier sources 531, 531' and process gas from process gas source 579 enter chamber lid/vaporizer assembly 800 through chamber lid 205 in the manner depicted in FIG. 10 with respect to process gas (elements 227/228). Briefly restated, these gases each pass through a chamber feed-through 227, 815, 817 and lid bore-through 228, 816, 818 for the process gas and carrier gases, respectively. O-rings are used in the transitions from chamber bore-through to lid bore-through to maintain passageway integrity.

Figure 26:
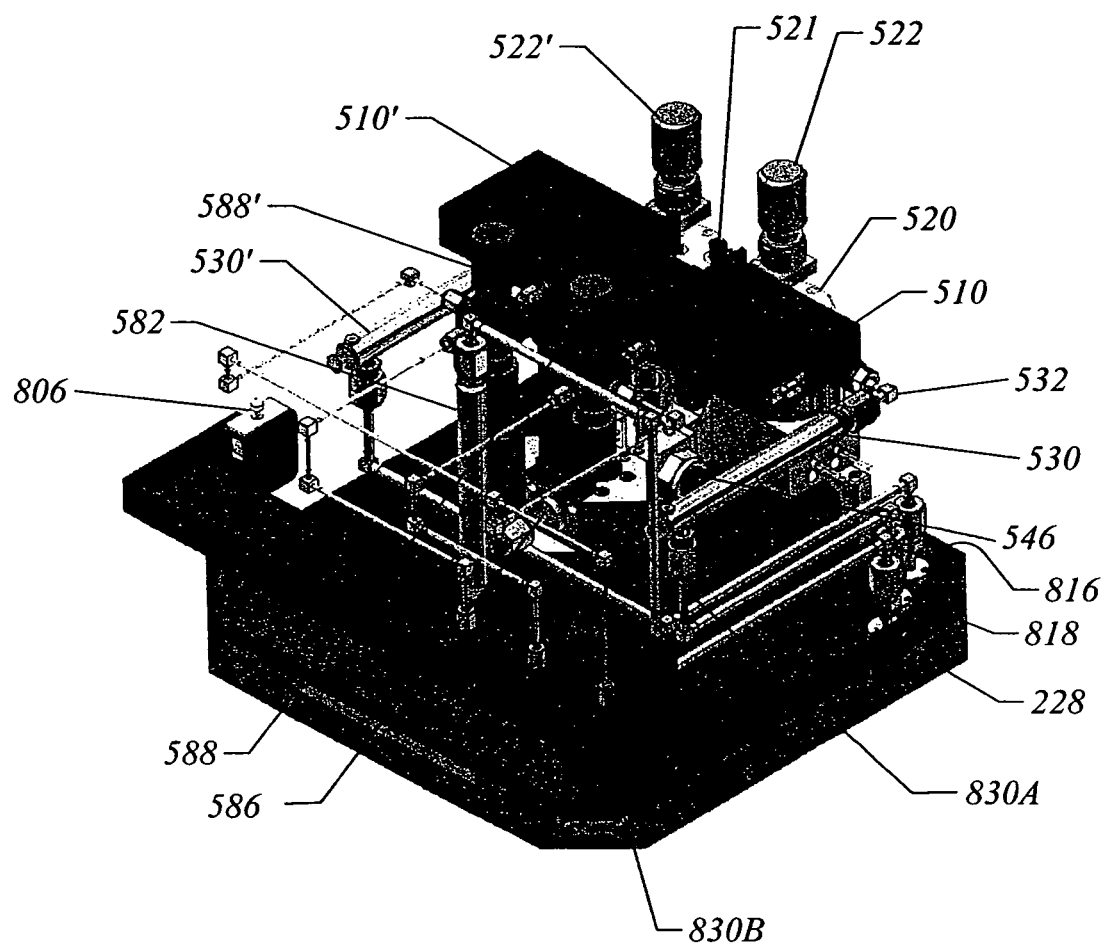
FIG. 26 is a second perspective view of an embodiment of the present invention with two vaporizers mounted on the chamber lid.

Process gas from source 579 is heated by process gas heater 582 and enters inlet and mixing block 830 (shown more clearly in FIG. 26). Carrier gas from source 531 is heated by carrier gas heat exchanger 530 before entering vaporizer 520. Similarly, carrier gas from source 531' is heated by carrier gas heat exchanger 530' before entering vaporizer 521. Precursor from container 503 enters chamber lid assembly through flexible double-contained liquid line 708, passes through three-way inlet valve 588, liquid flow meter 510, and positive shut off valve 522, before entering vaporizer 520. Similarly, precursor from container 504 enters chamber lid assembly through flexible double-contained liquid line 707, passes through three-way inlet valve 588', liquid flow meter 510', and positive shut off valve 522', before entering vaporizer 521. Solvent from container 589 enters chamber lid assembly through flexible double-contained liquid line 700 and flows through solvent delivery line 591 to both three-way inlet valves 588, 588'. Thus, as with the embodiment depicted in FIG. 2, three-way inlet valves 588, 588' may supply either precursor liquid or a solvent to their respective liquid flow meters, with the solvent used to flush the system for maintenance.

Vaporizers 520, 521 are mounted to vapor delivery manifolds 802, 803 respectively. In this embodiment, each liquid flow meter 510, 510' also includes a metering valve 524 (FIG. 15) and flow meters 510, 510' control precursor flow as described with reference to FIG. 15. Precursor liquid passes from positive shut-off valves 522, 522' to vaporizers 520, 521, respectively, which vaporize the liquid as discussed earlier with reference to FIGS. 2-16. Vaporizers 520, 521 then deliver the vapor to vapor delivery manifolds 802, 803, which in one embodiment have 0.500" diameter internal conduits 808. Delivery manifolds 802, 803 in turn deliver the vaporized precursor materials and carrier gas to common conduit 810 within union block 826. Common conduit 810 conveys the merged precursor materials and carrier gas to by-pass valve 545 that is within valve block 828. By-pass valve 545 functions as described with reference to FIG. 10 and either conveys the vapor to by-pass line 322, or to common conduit 811 that lies within mixing block 830. Common conduit 811 conveys the 2-precursor/carrier gas mixture to central conduit 834.

In a further aspect of this invention, common conduit 811 directs flow toward process gas inlet conduit 832 and process gas inlet conduit 832 directs flow toward common conduit 811. Thus, the process gas injection point of process gas inlet conduit 832 is opposed to common conduit 811 across central conduit 834. This opposed flow causes turbulence that ensures good mixing of the process gas with the vaporized precursors.

Central conduit 834 directs the mixture of vaporized precursors and process gas through conduit 230 in lid 205 and the precursors and gas pass through blocker plate 237 and showerhead 240 on the way to processing region 202 as discussed with reference to the embodiment depicted in FIG. 6.

Heated plasma manifold 270 is also connected to the mixing block 830 to deliver an activated species cleaning gas to processing region 202. The activated species, described earlier in FIG. 13, passes through chamber feed-through 229 and lid bore-through 221 and within conduit 271 through manifold 270 and block 830 before merging with mixing conduit 834.

The embodiment depicted in FIG. 21 maximizes the advantages gained by decreasing the distance from the vaporizer to the processing region, but functions generally as discussed with respect to FIGS. 2-18, as do the individual components. Differences exist between this embodiment and the earlier embodiments in the flow path from the vaporizers to the processing region. Specifically, when vaporizers 520, 521 were discussed with reference to FIGS. 2-18, each vaporizer directed vapor to individual by-pass valves 545, 570. In the chamber lid/vaporizer assembly embodiment depicted in FIGS. 19, 20, 23, 24, 27, 28, and 29 both vaporizers 520, 521 direct vapor to the same by-pass valve in the manner of the embodiment depicted in FIG. 19.

Also, in this embodiment, the pressure of each carrier gas is monitored upstream of the vaporization frit (not shown) within vaporizers 520, 521 using 100 Torr capacitance manometers (not shown). This allows the carrier gas inlet pressure to be periodically checked to determine if the vaporization frit is becoming clogged or needs maintenance. FIG. 21 also illustrates by dotted line the valves that are controlled by on-board software control module 1000. Although they are not illustrated in the earlier figures, similar connections from on-board software control module 1000 to pedestal heater controllers, power supplies, and various system monitors (such as pressure transducers, exhaust flow monitors, and pump signals) exist and facilitate the interlocks of Table I, below, and the automation of many aspects of the operation of the present invention.

Figure 22:
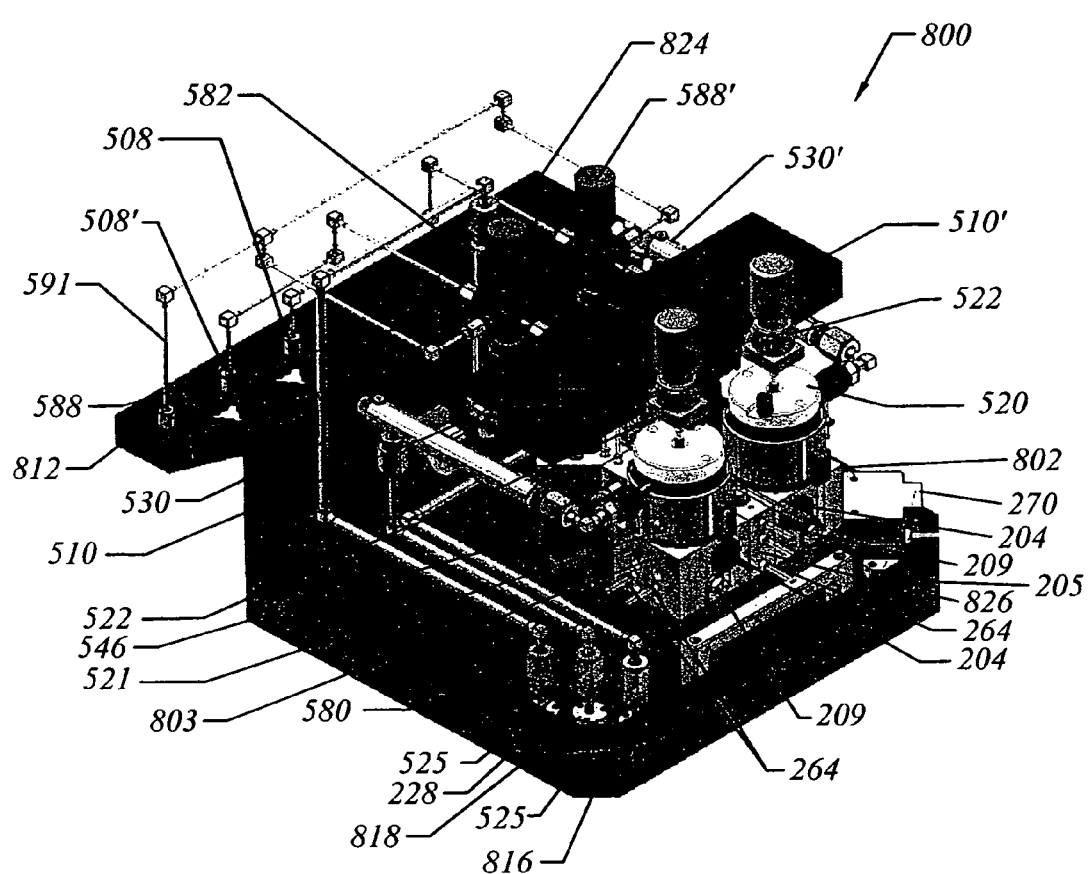
FIG. 22 is a perspective view of an embodiment of the present invention with two vaporizers mounted on the chamber lid.

FIG. 22 is a perspective view of an embodiment of the present invention with two vaporizers mounted on the chamber lid. The functional description of FIG. 21 applies equally to FIG. 22. In this embodiment, delivery manifolds 802, 803, union block 826, valve block 828 (FIGS. 23, 29) heated plasma manifold 270, and mixing block 830 are attached directly to each other. O-rings maintain the integrity of the conduits 808, 810, 811, 271 as they transition from one block to the next.

This view shows that delivery manifolds 802, 803 and union block 826 are independently heated using heater cartridges, such as heater cartridge 264. It is not shown, but valve block 828, mixing block 830, and heated plasma manifold 270 are also similarly independently heated. In this embodiment heater cartridges 264 are 208V cartridges of various power ratings. Each block has embedded thermocouples 204 for monitoring the temperature and providing feedback to the temperature controllers. Each manifold and vaporizer section is independently controlled by separate temperature controllers that allow each section to have different temperature set-points if needed as discussed with regard to the embodiment depicted in FIG. 2. The cartridge heater 264, thermocouple, and controller function was described in detail with reference to block 262 and manifold 272 of FIG. 6. Again, for clarity, the separate thermocouples and controllers have been mostly omitted, but, in this embodiment, these controllers work to independently control nine sections, are provided with over-temperature switches 209 (shown in manifolds 802, 803), and are capable of heating up to 230° C. In an embodiment of the invention, delivery manifolds 802, 803, union block 826, valve block 828, and mixing block 830 are heated to operate at temperatures of from 30° C. to 230° C. As part of the interlock system, over-temperature switches 209 switch off the related heater circuit should the temperature go too high, as listed in Table I below. In an embodiment of the invention, there are six independently controlled sections between vaporizers 520, 521 and central lid bore-through 230.

In this embodiment of the invention, by-pass valve 545 (FIG. 21) is implemented using a combination of two pneumatic on/off valves 546 (FIG. 26), 547 (FIG. 27) that are controlled by on-board software control module 1000 (FIG. 21). Both valves 546, 547 (FIG. 27) are normally closed. Valve 546 controls flow from common conduit 810 (FIG. 21) to common conduit 811 (FIG. 21). Valve 547 (FIG. 27) controls flow from common conduit 810 to by-pass line 322 (FIG. 21). By-pass line 322 (not shown in FIG. 22 for clarity) is a flexible vacuum hose that exits chamber lid/vaporizer assembly 800 through a hole in a lid cover 822 (FIG. 25) to eventually connect to chamber by-pass inlet 320 as depicted in FIG. 2. In this embodiment, three-way inlet valves 588, 588' are each a similar combination of two pneumatic on/off valves that are controlled by on-board software control module 1000 (FIG. 21).

With chamber lid/vaporizer assembly 800, precursor liquids and solvent arrive through lid shelf 812 to precursor supply lines 508, 508' and solvent delivery line 591. Lid shelf 812 translates and rotates when chamber lid 205 is opened. The apparatus for conveying precursor liquids from bulk containers 503, 504, and solvent container 589 to chamber lid/vaporizer assembly 800 must accommodate this lid movement.

Figure 23:
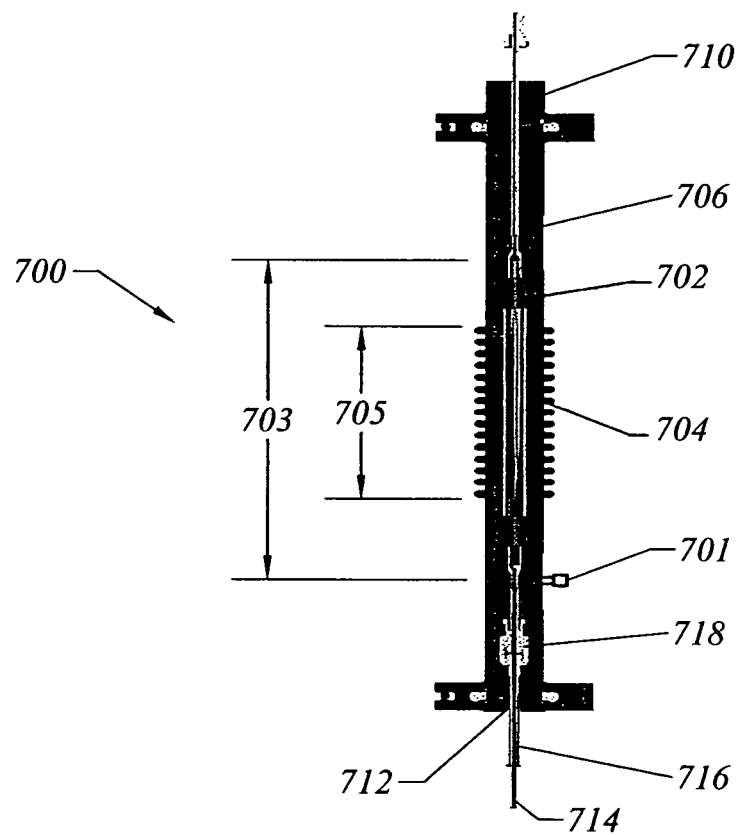
FIG. 23 is a cross-sectional view of an embodiment of the flexible double containment line of the present invention.

Now referring to FIG. 23, which is a cross-sectional view of an embodiment of the flexible double containment line of the present invention, flexible double-contained liquid lines 700, 707 (FIG. 25), and 708 (FIG. 24) flex to accommodate the movement of lid shelf 812. Flexible double-contained liquid line 700 contains a primary line 702 within a larger secondary line 704 and endcaps 710, 712. Secondary line 704 also prevents material loss should primary line 702 develop a leak. Both primary line 702 and secondary line 704 are equipped with flexible sections 703 and 705, respectively, that allow flexible double-contained liquid line 700 to bend. Volume 706 is defined by the space between primary line 702, secondary line 704, the endcaps 710, 712, rigid primary line 714, and rigid secondary line 716. Primary line 702 is connected to rigid primary line 714 at connector 718. Rigid primary line 714 extends through endcap 712 at hole 720, through LDS housing 108 (FIG. 24), and is connected to a bulk storage container (not shown). Hole 720 is larger than rigid primary line 714 so that annular volume 706 continues between rigid primary line 714 and endcap 712. Rigid secondary line 716 is connected to endcap 712 about rigid primary line 714 and houses rigid primary line 714 until line 714 passes through LDS housing 108. Where rigid primary line 714 enters LDS housing 108, the annular space between rigid secondary line 716 and rigid primary line 714 is sealed. Thus, annular volume 706 extends through endcap 712, between rigid primary line 714 and rigid secondary line 716 to the point where rigid secondary line 716 is sealed to rigid primary line 714.

Volume 706 is pressurized and monitored by a pressure monitor 701. The pressure in volume 706 is adjusted to be higher than any attained within primary line 702 during processing. Therefore, if primary line 702 develops a leak during processing, the pressure in volume 706 will drop. The liquid deposition system is interlocked to pressure monitor 701 so that, should the monitor detect a pressure drop, the liquid deposition system and any other interlocked system will shut down, similar to the conditions indicated by Table I for a LDS spill below. A typical pressure in volume 706 is about 60 p.s.i. In one embodiment, primary flexible section 703 is 0.125" O.D. (0.055" I.D.) line, rigid primary line has a 0.125" O.D., and rigid secondary line has a 0.25" O.D. Flexible double-contained liquid lines 707, 708 (FIG. 22) have the same construction as line 700.

Figure 25:
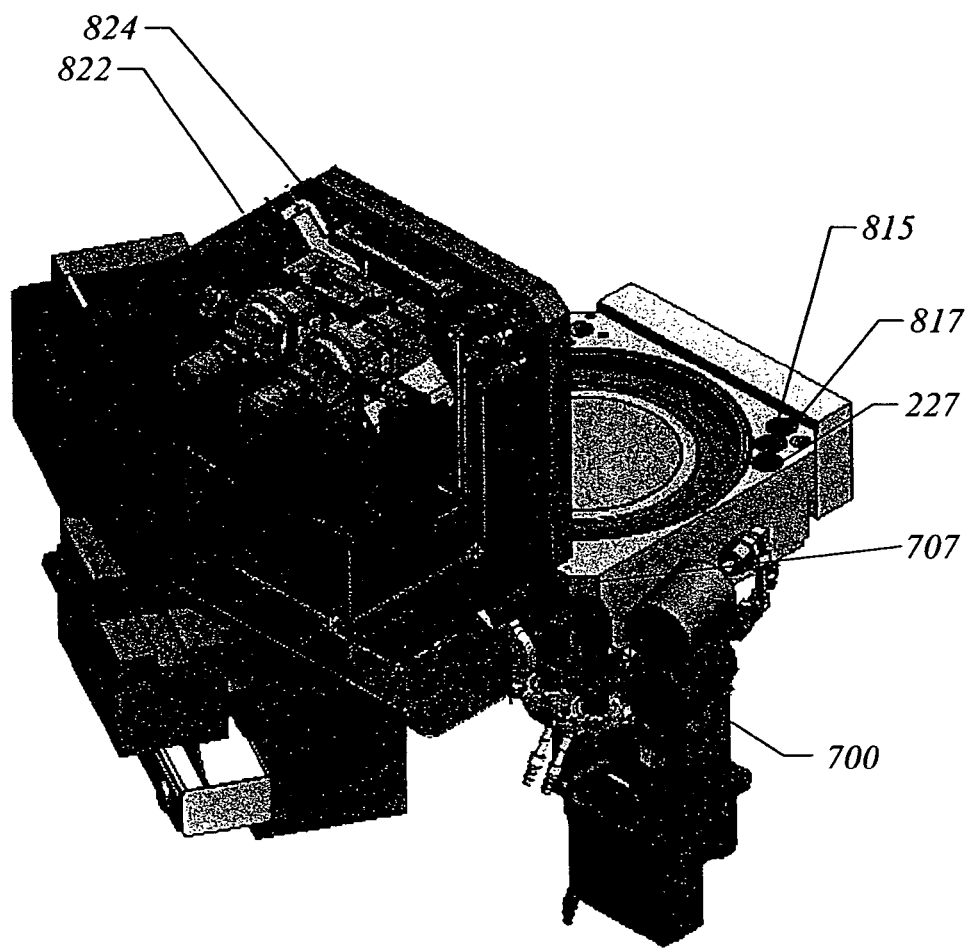
FIG. 25 is a perspective view of an embodiment of the present invention with two vaporizers mounted on the chamber lid with the chamber lid/vaporizer assembly in the open position.

Referring now to FIG. 25, which is a perspective view of an embodiment of the present invention with two vaporizers mounted on the chamber lid with the chamber lid/vaporizer assembly in the open position, flexible double-contained liquid lines 700, 707 are flexed because chamber lid/vaporizer assembly 800 is in the open position. The entire chamber lid/vaporizer assembly 800 is enclosed by an exhausted lid cover 822 (depicted translucently) that is designed to properly exhaust escaped gas and liquid to the foreline system. Lid cover 822 is larger than the previous cover 203 (FIG. 3) to accommodate the elements of two vaporizer systems. Both lid cover 822 and spill rail 824 cooperate to prevent operator exposure to hazardous or hot materials.

Now referring to FIG. 26, which is a second perspective view of an embodiment of the present invention with two vaporizers mounted on the chamber lid, oxidizer gas enters mixing block 830 from the side opposite from vaporizers 520, 521 and on/off valve 546. Also, in this figure, mixing block 830 has been arbitrarily divided into an upper mixing block 830A and a lower mixing block 830B for descriptive purposes. In this embodiment process gas enters upper mixing block 830A via process gas supply line 586 and process gas inlet conduit 832 (FIG. 21). Vaporized precursor enters upper mixing block 830A via common conduit 811 (FIG. 21). Plasma enters lower mixing block 830B through heated plasma manifold 270 and activated species conduit 271 (FIG. 21).

Figure 27:
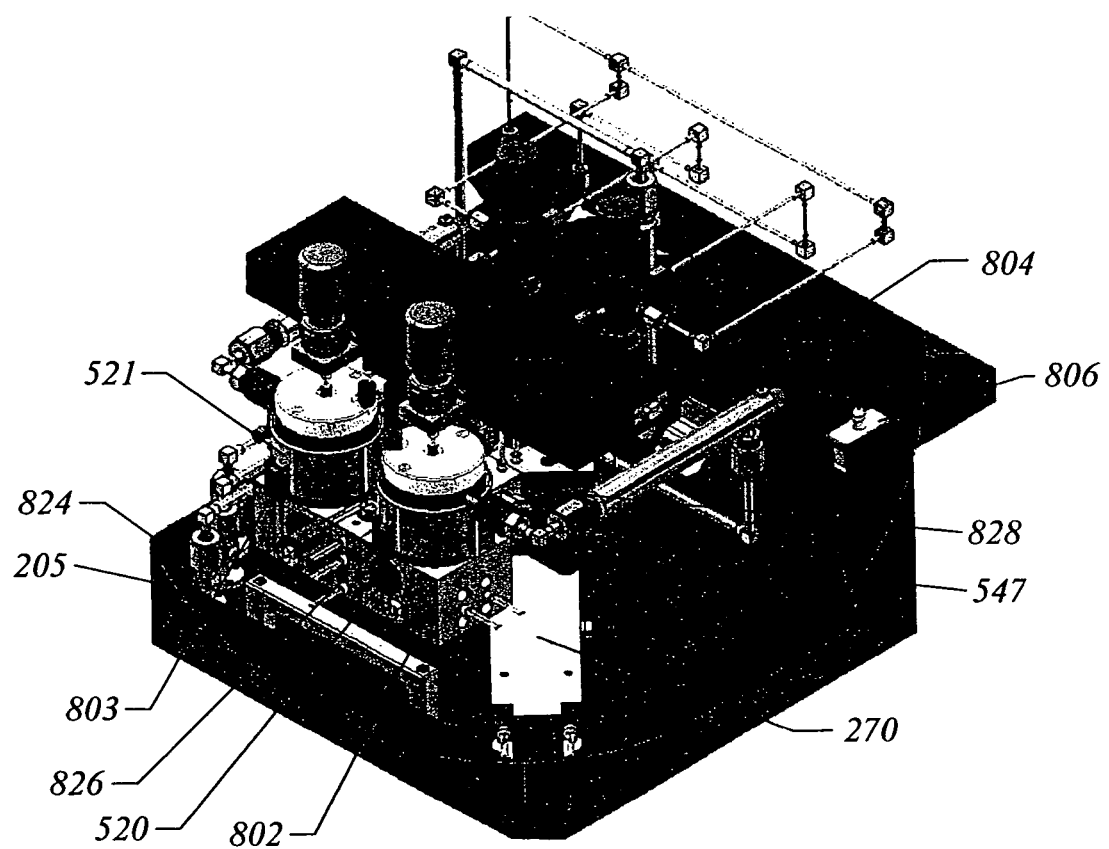
FIG. 27 is a third perspective view of an embodiment of the present invention with two vaporizers mounted on the chamber lid.

Advancing to FIG. 27, which is a third perspective view of an embodiment of the present invention with two vaporizers mounted on the chamber lid, aspects of the embodiment of chamber lid/vaporizer assembly 800 appear more clearly. Chamber lid 205 is designed with a spill rail 824 that captures and contains a liquid spill when chamber lid 205 is horizontal. Chamber lid/vaporizer assembly 800 is also equipped with liquid spill detector 804 and cover interlock switch 806. Spill detector 804 and cover interlock switch 806 are hardware switches that cause parts of the system to stop functioning as described in the "result" column of Table I should their status meet the criteria described in the "trip cause" column. Additionally, FIG. 27 further illustrates the relative positioning of vaporizers 520, 521, on/off valve 547, and valve block 828 above heated plasma manifold 270.

Many systems associated with chamber assembly 100 are interlocked. An interlock may be a hardware switch, or part of on-board software control system 1000 (FIG. 21) that, when activated or "tripped," prevents the continued operation of the interlocked system. A condition that activates an interlock is, thus, known as a "trip cause." Interlocked chamber assembly systems generally stop power to the heaters and prevent gas flows when the interlock is tripped. Most interlocks are designed so that the trip causes (which may be hard-wired circuits or software signals) are connected in series with the interlocked system. When any one of the trip causes in the series occurs, the interlocked system will be de-activated. One embodiment of the invention employs a series of electrical relays as interlocks, where a trip cause with opens an individual relay and stops power to the system. The interlocked systems of chamber assembly 100 are listed in the Result column of Table I which also contains the interlock name, trip cause, and whether the system is shut down via a hardware switch or software control. For example, chamber lid 205 is fitted with a position detector (not shown) that monitors the position of chamber lid 205 relative to chamber body 210. This position detector is normally open, and completes a circuit when lid 205 is closed. Chamber lid 205 is also interlocked so that it will not open if the pressure within processing region 202 is above 10 Torr. As listed in Table I, the systems that introduce material into processing region 202 or that heat processing region 202 are interlocked to the position detector and the pressure detector.

orders 1004, and notifies the user at step 1014 through a display (not shown) associated with control module 1000.

In one embodiment, software 1006 controls aspects of the gas and vapor delivery systems during system maintenance. For example, when system operators need to change a near-empty bulk storage container 503, 504 (FIGS. 14, 16, and 17) for a full container, gauges (not shown) in the bulk storage containers provide input 1002 to on-board software control module 1000 that a storage container is near empty. Software 1006 receives the input at step 1008 from the gauges, analyzes the input at step 1010, and commands the sub-system at step 1012, in this case vapor delivery system 500, to perform procedures that are associated with changing a bulk container. In this instance, when the bulk storage containers are empty, orders 1004 will stop power to the processing system.

Software 1006 is also employed during maintenance to run sub-routines called for by steps in the maintenance manual for processing system 100. In this manner, software 1006 receives directions from the operator as input at step 1008, as well as input from the processing systems 100. For example, software 1006 may be directed to run sub-routines that direct the sub-systems of processing system 100 to perform these other functions as well: 1) relieving pressure in the bulk storage containers 503, 504; 2) evacuating solvent delivery line 591; 3) Evacuating and re-charging the lines down stream of three-way inlet valves 588, 588' after a liquid flow meter or vaporizer component change; 4) purging precursor liquid lines from near the bulk storage containers 503, 504 to by-

TABLE I

| Interlock | Trip Cause | Result | Hardware or Software |
|---|---|---|---|
| Chamber Lid | Open chamber lid | Gas valves, heaters, chamber de-energized | Hardware Switch |
| Over Pressure | Chamber over pressure | Gas valves, heaters, chamber de-energized | Pressure transducer monitored by software and Hardware Switch |
| H$_2$O Flow Low Flow | Low H$_2$O flow at one of the cooling loops | Water heater and multi loop heater controller power de-energized | Hardware relay control |
| Liquid Leak Detector Action | Optical switch in spill pan | Gas and precursor valves de-energized | Hardware switch |
| Roughing Pump OK | Loss of OK signal from pump | Gas, precursor valves and heater de-energized | Hardware switch |
| Liquid Delivery System (LDS) Exhaust | Loss of ventilation to LDS | Gas and precursor valves in LDS and vaporizer de-energized | Hardware switch |
| LDS Spill | Leak detected in LDS spill pan | Gas and precursor valves in LDS and vaporizer de-energized | Hardware switch |
| LDS Door | Magnetic proximity switch on door is open | Gas and precursor valves de-energized | Hardware switch |
| Vaporizer Spill | Leak detected in LDS spill pan | Gas and precursor valves de-energized | Hardware switch |
| Vaporizer Exhaust | Loss of ventilation to vaporizer | Gas and precursor valves de-energized | Hardware switch |
| Over-Temp Switch | Thermal control failure | Snap switch opens supply line to heater blanket | Hardware switch |

Figure 28:
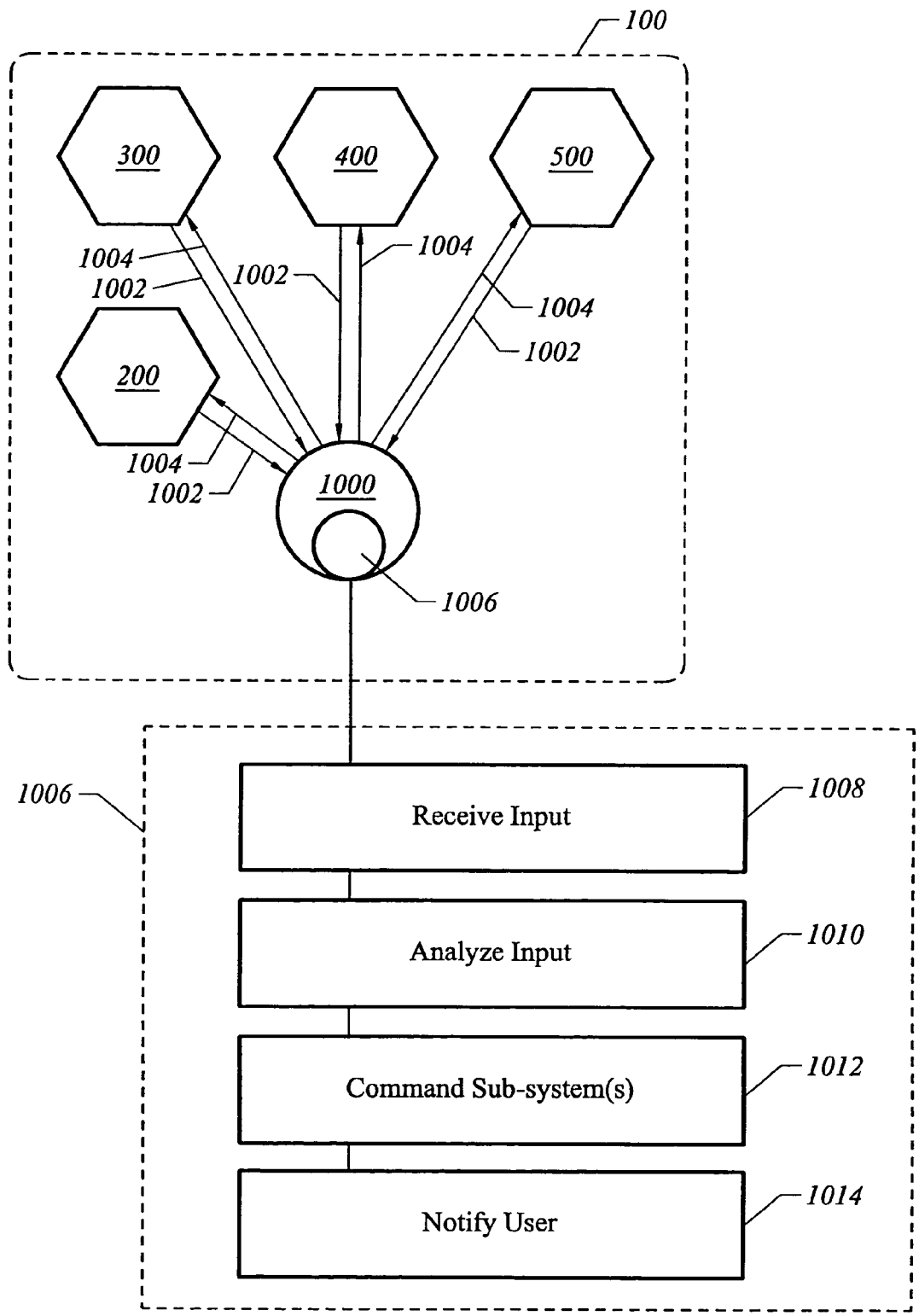
FIG. 28 is a flow chart illustrating automation of the processing system according to an embodiment of the invention.

It is a further aspect of the invention that the chamber assembly is partly automated by on-board software control module 1000. Referring to FIG. 28, which is a flow chart illustrating automation of the processing system according to an embodiment of the invention, sub-systems of processing system 100 send input 1002 to control module 1000. Software 1006 receives the input at step 1008, analyzes the input at step 1010, commands the appropriate elements of the sub-system(s) at step 1012 to perform responsive procedures by sending pass valve 545; 5) flushing solvent deliver line 591 with solvent and helium after a precursor bulk storage container change; 6) evacuating precursor liquid supply lines from precursor bulk storage container to by-pass valve 545; 7) charging precursor delivery supply lines between precursor bulk storage container and chamber with precursor; 8) flushing liquid flow meters 510, 510' and vaporizers 520, 521 with solvent; 9) purging liquid flow meters 510, 510' and vaporizers 520, 521 with helium; 10) flushing the lines from bulk storage supply containers to liquid flow meters with solvent and pumping them down; 11) relieving the pressure in the solvent bulk storage container; 12) evacuating solvent delivery line 591 for bulk storage container change; and 13) charging precursor supply lines 508, 508' after changing bulk storage containers.

Also, on-board computer control module 1000 and software 1006 are part of the interlock that commands a sub-system to shut down in case of a system overpressure and the interlock that commands a sub-system to shut down in case of the loss of the roughing pump OK signal, as listed in Table I.

It is to be understood that while illustrative embodiments of the invention have been shown and described herein, various changes and adaptions in accordance with the teachings of the invention will be apparent to those of ordinary skill in the art. Such changes and adaptions nevertheless are included within the spirit and scope of the invention as defined in the following claims.

What is claimed is:

1. An apparatus for depositing a film, the apparatus comprising:
    a chamber body having a processing region defined therein;
    a first vaporizer;
    a vapor delivery system connecting the first vaporizer and the processing region with a first vapor path of less than approximately three feet from the first vaporizer through the vapor delivery system to the processing region;
    a chamber lid disposed on the chamber body;
    a showerhead coupled to the chamber lid; and
    a seal interfacing with the chamber body and the chamber lid, wherein the chamber lid further comprises:
        a body having an inner body region and a circumscribing outer body region;
        a first temperature control zone defined in the outer body region and in thermal contact with the seal, the first temperature control zone including an annular coolant fluid passageway disposed radially outward of the showerhead and proximate an outer perimeter of the chamber lid and the seal; and
        a second temperature control zone defined in the inner body region, the second temperature control zone abutting and in thermal communication with the processing region and the first temperature control zone, the second temperature control zone including an annular resistive heater disposed radially inward of the coolant fluid passageway and above the showerhead, the resistive heater disposed in an annular groove formed in a top of the chamber lid, the groove formed radially inward of an outer edge of the showerhead.

2. The apparatus of claim 1, wherein the second temperature controlled lid zone is maintained at a temperature greater than the first temperature controlled lid zone.

3. The apparatus of claim 1, wherein the vapor delivery system further comprises:
    a plurality of heated zones;
    a heater in thermal contact with each the heated zone;
    a thermocouple in thermal contact with each the heated zone; and
    a plurality of temperature controllers, wherein each of the plurality of temperature controllers is in communication with a heater and thermocouple in a different one of the plurality of heated zones to maintain the heated zones at a target temperature.

4. The apparatus of claim 1, wherein the vapor delivery system further comprises:
    a plurality of heated zones;
    a heater in thermal contact with each of the heated zones;
    a thermocouple in thermal contact with each the heated zones; and
    a plurality of temperature controllers, wherein each of the plurality of temperature controllers is in communication with a heater and thermocouple in a different one of the plurality of heated zones to maintain at least one of the heated zones at a first target temperature and another of the heated zones at a second target temperature.

5. The apparatus of claim 1, the vapor delivery system further comprising:
    a first vapor three-way valve between the first vaporizer and the processing region, the first vapor three-way valve connecting the first vaporizer to the processing region or to an exhaust system.

6. The apparatus of claim 1 further comprising:
    a liquid delivery system comprising:
        a first precursor container for holding a first precursor;
        a solvent container for holding a solvent; and
        a liquid three-way valve selectively connecting the first vaporizer to the first precursor container or to the solvent container.

7. The apparatus of claim 6, wherein the liquid delivery system further comprises:
    a liquid flow meter disposed between the liquid three-way valve and the first vaporizer.

8. The apparatus of claim 1 further comprising:
    a passageway formed in the chamber body;
    a sensor positioned to provide a metric indicative of temperature of the passageway;
    a fluid heater; and
    a temperature controller configured regulate the fluid heater in response to the metric provided by sensor to maintain a fluid in the passageway at a predetermined temperature.

9. The apparatus of claim 1, wherein the first vapor path further comprises:
    a first region beginning at the vaporizer and a second region communicating with the processing region, wherein the first region is maintained at a lower temperature than the second region.

10. The apparatus of claim 9, wherein a temperature gradient defined over the first and second regions is between about 20 to about 25 degrees Celsius.

11. The apparatus of claim 9, wherein the first vapor path further comprises:
    a third region disposed between the first region and the second region, wherein a carrier gas supply line is coupled to the first vapor path at a transition between the first and third regions.

12. The apparatus of claim 11, wherein a diameter of the third region is greater than a diameter of the first region and less than a diameter of the second region.

13. The apparatus of claim 11, wherein a temperature of the third region is greater than a temperature of the first region and less than a temperature of the second region.

14. The apparatus of claim 1 further comprising:
    a hafnium precursor source coupled to the first vaporizer.

15. The apparatus of claim 1, wherein the first vapor flow path is maintained at a temperature gradient that increases from the first vaporizer.

16. The apparatus of claim 15, wherein the temperature gradient is maintained between a minimum temperature of 100 degrees Celsius and a maximum temperature of 190 degrees Celsius.

17. The apparatus of claim 1 further comprising:
- a second vaporizer;
- a second vapor delivery system connecting the second vaporizer and the processing region with a second vapor path of less than approximately three feet from the second vaporizer through the second vapor delivery system to the processing region.

* * * * *